United States Patent
Tao et al.

(10) Patent No.: US 9,983,269 B2
(45) Date of Patent: May 29, 2018

(54) APPARATUS AND METHOD FOR ESTIMATING LIFE OF ENERGY STORAGE DEVICE AND ENERGY STORAGE SYSTEM

(71) Applicant: GS Yuasa International Ltd., Kyoto-shi, Kyoto (JP)

(72) Inventors: Yohei Tao, Kyoto (JP); Shigeki Yamate, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 268 days.

(21) Appl. No.: 14/917,797

(22) PCT Filed: Aug. 11, 2014

(86) PCT No.: PCT/JP2014/004174
§ 371 (c)(1),
(2) Date: Mar. 9, 2016

(87) PCT Pub. No.: WO2015/037184
PCT Pub. Date: Mar. 19, 2015

(65) Prior Publication Data
US 2016/0223617 A1    Aug. 4, 2016

(30) Foreign Application Priority Data

Sep. 11, 2013  (JP) .................................. 2013-188773

(51) Int. Cl.
*G01N 27/416*    (2006.01)
*G01R 31/36*     (2006.01)
(Continued)

(52) U.S. Cl.
CPC ..... *G01R 31/3662* (2013.01); *G01R 31/3651* (2013.01); *G01R 31/3679* (2013.01); *H01M 10/0525* (2013.01); *H01M 10/4207* (2013.01)

(58) Field of Classification Search
CPC .................................................... G01N 27/416
(Continued)

(56) References Cited

U.S. PATENT DOCUMENTS

2004/0085072 A1 *  5/2004  Kanou  ............... G01R 31/3662
                                                                      324/426
2006/0113959 A1 *  6/2006  Honma  .............. G01R 31/3662
                                                                      320/128

FOREIGN PATENT DOCUMENTS

| JP | 10-040967    | 2/1998  |
| JP | 2002-343444  | 11/2002 |
| JP | 2011-036046  | 2/2011  |

OTHER PUBLICATIONS

Partial Machine Translation of JP 2002-343444, Nov. 29, 2002.*
(Continued)

*Primary Examiner* — Bot Ledynh
(74) *Attorney, Agent, or Firm* — Rankin, Hill & Clark LLP

(57) ABSTRACT

A life estimating apparatus estimating a residual life that is of a usable accumulated residual period of an energy storage device, the life estimating apparatus includes: a relational expression acquisition unit that acquires a relational expression, in which a resistance value of a DC resistance or an AC resistance of the energy storage device at an accumulated use period elapsed time point that is of an accumulated value of a use period of the energy storage device is given by an expression including a term of a function of the accumulated use period; and a residual life estimating unit that estimates the residual life of the energy storage device using the acquired relational expression. When a value in which the resistance value in the relational expression is differentiated by the accumulated use period twice becomes a positive value, the relational expression acquisition unit sets the accumulated use period to a relational expression acquisition (Continued)

period, and acquires the relational expression obtained from a relationship between the resistance value and the accumulated use period up to the relational expression acquisition period elapsed time point.

11 Claims, 14 Drawing Sheets

(51) Int. Cl.
    *H01M 10/0525*    (2010.01)
    *H01M 10/42*      (2006.01)

(58) Field of Classification Search
    USPC .......................................................... 324/430
    See application file for complete search history.

(56) References Cited

OTHER PUBLICATIONS

International Search Report dated Nov. 4, 2014 filed in PCT/JP2014/004174.
J. Belt et al., "Calendar and PHEV cycle life aging of high-energy, lithium-ion cells containing blended spinel and layered-oxide cathodes" Journal of Power Sources, vol. 196, 2011, pp. 10213-10221.

\* cited by examiner

| Resistance value | Accumulated use period |
|---|---|
| $R_1$ | $t_1$ |
| $R_2$ | $t_2$ |
| $R_3$ | $t_3$ |
| ⋮ | ⋮ |

132

| | Prediction formula [R=f(t)] | Residual life [t2-t1] (cycle) |
|---|---|---|
| Cubic polynomial law (Example 1) | $R=4.46\times10^{-8}\times t^3-6.95\times10^{-5}\times t^2 +0.119\times t+118.8$ | 1270 (Δ30) |
| Linear law (Comparative example 1-1) | $R=0.0962\times t+117.9$ | 2486 (+1186) |
| Root law (Comparative example 1-2) | $R=3.13\times t^{1/2}+102.7$ | 9864 (+8564) |
| 1.52-order law (Comparative example 1-3) | $R=3.85\times10^{-3}\times t^{1.52}+121.5$ | 963 (Δ337) |
| Measured value | | 1300 |

| | Prediction formula [R=f(t)] | Residual life [t₂-t₁] (cycle) |
|---|---|---|
| Cubic polynomial law (Example 2) | $R=5.79\times10^{-9}\times t^3+1.41\times10^{-5}\times t^2 +0.0436\times t+90.4$ | 1362(+62) |
| Linear law (Comparative example 2-1) | $R=0.0868\times t+70.7$ | 1840 (+540) |
| Root law (Comparative example 2-2) | $R=2.94\times t^{1/2}+55.1$ | 5749 (+4449) |
| 1.52-order law (Comparative example 2-3) | $R=2.89\times10^{-3}\times t^{1.52}+75.7$ | 906(Δ394) |
| Measured value | | 1300 |

(b)

| | Prediction formula [R=f(t)] | Residual life [$t_2$-$t_1$] (cycle) |
|---|---|---|
| Exponential law (Example 1b-1) | $R = 83.9 \times \exp(6.410 \times 10^{-4} \times t)$ | 1641 (Δ59) |
| Linear law (Comparative example 1b-1) | $R = 0.147 \times t + 63.9$ | 1246 (Δ454) |
| Root law (Comparative example 1b-2) | $R = 2.77 \times t^{1/2} + 56.9$ | 6834 (+5134) |
| 1.52-order law (Comparative example 1b-3) | $R = 6.87 \times 10^{-3} \times t^{1.52} + 68.1$ | 629 (Δ1071) |
| Measured value | | 1700 |

(a)

(b)

| | Prediction formula [R=f(t)] | Residual life [$t_2$-$t_1$] (cycle) |
|---|---|---|
| Exponential law (Example 2a-1) | $R = 101.7 \times \exp(2.875 \times 10^{-4} \times t)$ | 1685 (Δ15) |
| Linear law (Comparative example 2a-1) | $R = 0.047 \times t + 100.0$ | 1402 (Δ298) |
| Root law (Comparative example 2a-2) | $R = 0.902 \times t^{1/2} + 97.5$ | 8064 (+6364) |
| 1.52-order law (Comparative example 2a-3) | $R = 2.11 \times 10^{-3} \times t^{1.52} + 101.4$ | 717 (Δ983) |
| Measured value | | 1700 |

(a)

(b)

| | Prediction formula [R=f(t)] | Residual life [$t_2$-$t_1$] (cycle) |
|---|---|---|
| Exponential law (Example 2b-1) | $R = 59.0 \times \exp(2.811 \times 10^{-4} \times t)$ | 1591 (Δ109) |
| Linear law (Comparative example 2b-1) | $R = 0.05 \times t + 52.2$ | 664 (Δ1036) |
| Root law (Comparative example 2b-2) | $R = 0.811 \times t^{1/2} + 52.2$ | 3232 (+1532) |
| 1.52-order law (Comparative example 2b-3) | $R = 2.27 \times 10^{-3} \times t^{1.52} + 53.8$ | 387 (Δ1313) |
| Measured value | | 1700 |

APPARATUS AND METHOD FOR ESTIMATING LIFE OF ENERGY STORAGE DEVICE AND ENERGY STORAGE SYSTEM

TECHNICAL FIELD

The present invention relates to a life estimating apparatus and a life estimating method for estimating a residual life that is of a usable accumulated residual period of an energy storage device, and an energy storage system provided with the energy storage device and the life estimating apparatus.

BACKGROUND ART

Energy storage devices such as a lithium-ion secondary battery are used as power supplies for mobile devices such as a notebook computer and a mobile phone, and nowadays used in a wide range of fields such as a power supply for an electric automobile. In such energy storage devices, it is necessary to correctly recognize the residual life that is of the usable accumulated residual period of the energy storage device. Conventionally, a technology of estimating a variation with time of a DC resistance of the energy storage device has been proposed in order to estimate the residual life of the energy storage device (for example, see Non-Patent Document 1).

Non-Patent Document 1 discloses a technology of estimating the variation with time of the DC resistance of a battery at a predetermined test time using an empirical formula in which the variation with time of the DC resistance is given by an N-order function of test time. Incidentally, N of the empirical formula is ½, 1, or 1.52, and changes according to a test mode.

PRIOR ART DOCUMENTS

Non-Patent Document

Non-Patent Document 1: J. Belt et al., Journal of Power Sources, vol. 196, 2011, page 10213-10221.

SUMMARY OF THE INVENTION

Problems to be Solved by the Invention

However, in the conventional technology, there is a difficulty in that the residual life of the energy storage device may not correctly be estimated.

The present invention has been made to provide a life estimating apparatus, a life estimating method, and an energy storage system that enable to correctly estimate the residual life of the energy storage device.

Means for Solving the Problems

According to one aspect of the present invention, a life estimating apparatus estimating a residual life that is of a usable accumulated residual period of an energy storage device, the life estimating apparatus includes: a relational expression acquisition unit that acquires a relational expression, in which a resistance value of a DC resistance or an AC resistance of the energy storage device at an accumulated use period elapsed time point that is of an accumulated value of a use period of the energy storage device is given by an expression including a term of an Nth-degree function (N≥3) or an exponential function of the accumulated use period; and a residual life estimating unit that estimates the residual life using the acquired relational expression.

Not only the present invention can be implemented as the life estimating apparatus, but also the present invention can be implemented as an energy storage system including the energy storage device and the life estimating apparatus estimating the residual life of the energy storage device. The present invention can also be implemented as a life estimating method including characteristic processing performed by the life estimating apparatus. The present invention can also be implemented as an integrated circuit including a characteristic processor included in the life estimating apparatus. The present invention can also be implemented as a program causing a computer to execute the characteristic processing included in the life estimating method, or as a computer-readable recording medium, such as a CD-ROM, in which the program is recorded. The program can be distributed through the recording medium such as the CD-ROM and a transmission medium such as the Internet.

Advantages of the Invention

In the present invention, the residual life of the energy storage device can correctly be estimated.

MODE FOR CARRYING OUT THE INVENTION

Figure 1:
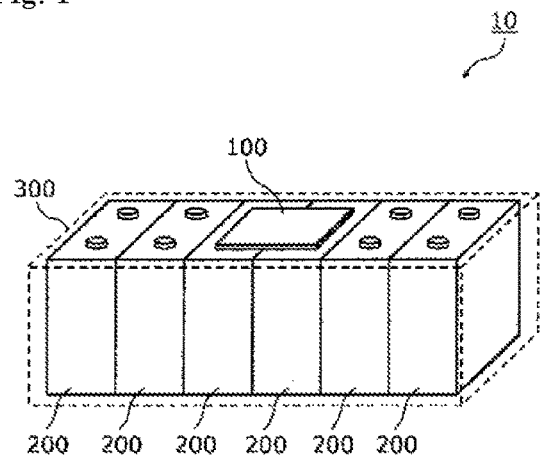
FIG. 1 is an outline drawing of an energy storage system including a life estimating apparatus according to an embodiment of the present invention.

In the conventional technology, there is the difficulty in that the residual life of the energy storage device may not correctly be estimated.

In the conventional technology of estimating the variation with time of the DC resistance of the energy storage device, the value of N in the empirical formula is hardly predicted because the value of N changes according to the test mode. Even if the value of N can be predicted, the estimated variation with time of the DC resistance is insufficiently correct. Therefore, in the conventional technology, the residual life of the energy storage device cannot correctly be estimated.

The present invention has been made to provide a life estimating apparatus, a life estimating method, and an energy storage system that enable to correctly estimate the residual life of the energy storage device.

According to one aspect of the present invention, a life estimating apparatus estimating a residual life that is of a usable accumulated residual period of an energy storage device, the life estimating apparatus includes: a relational expression acquisition unit that acquires a relational expression, in which a resistance value of a DC resistance or an AC resistance of the energy storage device at an accumulated use period elapsed time point that is of an accumulated value of a use period of the energy storage device is given by an expression including a term of an Nth-degree function (N≥3) or an exponential function of the accumulated use period; and a residual life estimating unit that estimates the residual life using the acquired relational expression.

Accordingly, the life estimating apparatus acquires a relational expression, in which the resistance value of the DC resistance or AC resistance of the energy storage device at the accumulated use period elapsed time point is given by the expression including the term of the Nth-degree function (N≥3) or exponential function of the accumulated use period, and estimates the residual life of the energy storage device using the relational expression. At this point, the resistance value increases exponentially with passage of the accumulated use period. As a result of the study and experiment, the inventors found that the variation with time of the resistance value is given by an expression including the term of the Nth-degree function (N≥3) or exponential function of the accumulated use period in which the accumulated use period is used as a variable. In the life estimating apparatus, because the relationship between the resistance value and the accumulated use period can correctly be given by the relational expression, the residual life of the energy storage device can correctly be estimated.

The relational expression acquisition unit may acquire the relational expression in which the resistance value is given by a polynomial including the cubic function of the accumulated use period.

Accordingly, the life estimating apparatus acquires the relational expression in which the resistance value is given by a polynomial including the cubic function of the accumulated use period. As a result of the study and experiment, the inventors found that the relational expression in which the resistance value is given by the polynomial including the cubic function of the accumulated use period accurately expresses the variation with time of the resistance value. In the life estimating apparatus, because the relationship between the resistance value and the accumulated use period can correctly be given by the relational expression, the residual life of the energy storage device can correctly be estimated.

In the case that a value in which the resistance value in the relational expression is differentiated by the accumulated use period twice becomes a positive value, the relational expression acquisition unit may set the accumulated use period to a relational expression acquisition period, and acquire the relational expression obtained from a relationship between the resistance value and the accumulated use period up to the relational expression acquisition period elapsed time point.

In the case that the value in which the resistance value is differentiated by the accumulated use period twice becomes a negative value, a state in which the resistance value increases exponentially with the passage of the accumulated use period can hardly be predicted because the graph of the resistance value to the accumulated use period is expressed by a function convex upward (concave function). That is, in the case that the value in which the resistance value is differentiated by the accumulated use period twice becomes the positive value, the life estimating apparatus can predict the state in which the resistance value increases exponentially with the passage of the accumulated use period by acquiring the relational expression obtained from the relationship between the resistance value and the accumulated use period up to the accumulated use period elapsed time point. Therefore, in the life estimating apparatus, because the relationship between the resistance value and the accumulated use period can correctly be given by the relational expression, the residual life of the energy storage device can correctly be estimated.

The relational expression acquisition unit may acquire the relational expression by calculating the relational expression from the relationship between the resistance value and the accumulated use period up to the relational expression acquisition period elapsed time point.

Accordingly, the life estimating apparatus calculates the relational expression from the relationship between the resistance value and the accumulated use period up to the accumulated use period elapsed time point when the value in which the resistance value is differentiated by the accumulated use period twice becomes the positive value. The life estimating apparatus can acquire the relational expression that can predict the state in which the resistance value increases exponentially with the passage of the accumulated use period without storing the relational expression in the storage. Therefore, in the life estimating apparatus, because the relationship between the resistance value and the accumulated use period can correctly be given by the relational expression, the residual life of the energy storage device can correctly be estimated.

The relational expression acquisition unit may acquire the relational expression, in which the resistance value is proportional to the exponential function having a variable in which the accumulated use period is multiplied by a predetermined constant.

Accordingly, the life estimating apparatus acquires the relational expression, in which the resistance value is proportional to the exponential function having a variable in which the accumulated use period is multiplied by a predetermined constant. As a result of the study and experiment, the inventors found that the relational expression, in which the resistance value is proportional to the exponential function having a variable in which the accumulated use period is multiplied by a predetermined constant, accurately expresses the variation with time of the resistance value. In the life estimating apparatus, because the relationship between the resistance value and the accumulated use period can correctly be given by the relational expression, the residual life of the energy storage device can correctly be estimated.

The residual life estimating unit may include: a resistance value acquisition unit that acquires a first resistance value and a second resistance value, the first resistance value being the resistance value at a predetermined time point, the second resistance value being the resistance value at a life expiration time point of the energy storage device; a period acquisition unit that acquires a first accumulated use period and a second accumulated use period, the first accumulated use period being the accumulated use period in the first resistance value obtained from the relational expression, the second accumulated use period being the accumulated use period in the second resistance value obtained from the relational expression; and a residual life calculation unit that calculates the residual life of the energy storage device from the predetermined time point by subtracting the first accumulated use period from the second accumulated use period.

Accordingly, the life estimating apparatus acquires the first resistance value at the predetermined time point and the second resistance value at the life expiration time point of the energy storage device, acquires the first accumulated use period in the first resistance value and the second accumulated use period in the second resistance value, which are obtained from the relational expression, and calculates the residual life of the energy storage device from the predetermined time point by subtracting the first accumulated use period from the second accumulated use period. Thus, the life estimating apparatus can correctly estimate the residual life of the energy storage device.

The residual life estimating unit may further include a relational expression correction unit that corrects the relational expression acquired by the relational expression acquisition unit. At this point, the residual life may be estimated using the corrected relational expression.

Accordingly, the life estimating apparatus corrects the relational expression, and estimates the residual life using the corrected relational expression. Thus, the life estimating apparatus corrects the relational expression to improve the accuracy of the relational expression, which allows the correct estimation of the residual life.

The energy storage device may be a lithium-ion secondary battery containing a layered-structure lithium transition metal oxide as a positive active material, the relational expression acquisition unit may acquire the relational expression for the lithium-ion secondary battery, and the residual life estimating unit may estimate the residual life of the lithium ion secondary battery.

Accordingly, the energy storage device is the lithium-ion secondary battery containing the layered-structure lithium transition metal oxide as the positive active material. As a result of the study and experiment, the inventors found that a degradation state can correctly be given by the relational expression when the energy storage device is the lithium-ion secondary battery. Thus, the life estimating apparatus can correctly estimate the residual life of the lithium-ion secondary battery.

Hereinafter, a life estimating apparatus of an energy storage device according to an embodiment of the present invention and an energy storage system including the life estimating apparatus will be described with reference to the drawings. A preferably specific example of the present invention is described in the following embodiment. In the following embodiment, a numerical value, a shape, a material, a component, a disposition state and a connection state of the component, a step, and a step sequence are described by way of example, and the present invention is not limited to them. In the components of the following embodiment, the component that is not described in an independent claim indicating a top concept of the present invention is described as an arbitrary component constituting a preferable mode.

A configuration of an energy storage system 10 will be described below.

FIG. 1 is an outline drawing of an energy storage system 10 including a life estimating apparatus 100 according to the embodiment of the present invention.

As illustrated in FIG. 1, the energy storage system 10 includes a life estimating apparatus 100, plural energy storage devices 200 (in FIG. 1, six energy storage devices 200), and a housing case 300 in which the life estimating apparatus 100 and the plural energy storage devices 200 are accommodated.

The life estimating apparatus 100 is disposed above the plural energy storage devices 200, and is a circuit board equipped with a circuit estimating lives of the plural energy storage devices 200. Specifically, the life estimating apparatus 100 is connected to the plural energy storage devices 200, and acquires information from the plural energy storage devices 200 to estimate the residual life that is of the usable accumulated residual periods of the plural energy storage devices 200. The functional configuration of the life estimating apparatus 100 is described in detail later.

Although the life estimating apparatus 100 is disposed above the plural energy storage devices 200 in the embodiment, the life estimating apparatus 100 may be disposed at any position.

The energy storage device 200 is a secondary battery such as a nonaqueous electrolyte secondary battery including positive and negative electrodes.

In FIG. 1, the six rectangular energy storage devices 200 are disposed in series to construct an assembled battery. The number of energy storage devices 200 is not limited to six, but one or plural pieces except six of energy storage devices 200 may be disposed. There is no particular limitation to a shape of the energy storage device 200.

Preferably the energy storage device 200 is a lithium-ion secondary battery that contains a lithium transition metal oxide having a layered structure as a positive active material. Specifically, the lithium transition metal oxide, such as $Li_{1+x}M_{1-y}O_2$ is one or two or more transition metal elements selected from Fe, Ni, Mn, Co, and the like, $0 \leq x < \frac{1}{3}$, and $0 \leq y < \frac{1}{3}$), which has the layered structure is preferably used as the positive active material.

A spinel type lithium manganese oxide such as $LiMn_2O_4$ and $LiMn_{1.5}Ni_{0.5}O_4$ or an olivine type positive active material such as $LiFePO_4$ and the lithium transition metal oxide having the layered structure may be mixed with each other as the positive active material.

Any known material can be used as a negative active material as long as the material can occlude and release a lithium ion. In addition to a lithium metal and a lithium alloy (lithium metal containing alloy such as lithium-silicon, lithium-aluminum, lithium-lead, lithium-tin, lithium-aluminum-tin, lithium-gallium, and Wood's alloy), examples of the material include an alloy that can occlude and release lithium, a carbon material (such as graphite, hardly graphitizable carbon, easily graphitizable carbon, low-temperature baked carbon, and amorphous carbon), silicon oxide, metal oxide, lithium metal oxide (such as $Li_4Ti_5O_{12}$), a polyphosphoric acid compound, and a compound of a transition metal and a group 14 element to a group 16 element, such as $Co_3O_4$ and $Fe_2P$, which is generally called a conversion negative electrode.

The functional configuration of the life estimating apparatus 100 will be described in detail below.

Figure 2:
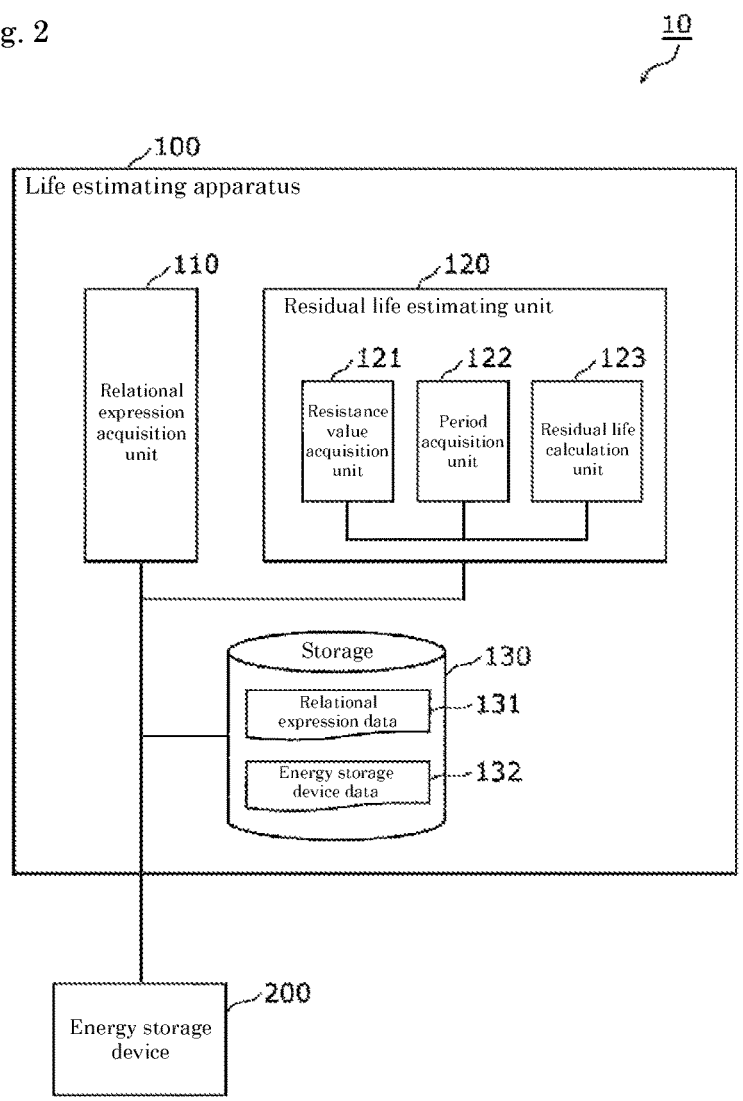
FIG. 2 is a block diagram illustrating a functional configuration of the life estimating apparatus according to the embodiment of the present invention.

FIG. 2 is a block diagram illustrating the functional configuration of the life estimating apparatus 100 according to the embodiment of the present invention.

The life estimating apparatus 100 estimates the residual life that is of the usable accumulated residual period of the energy storage device 200. As illustrated in FIG. 2, the life estimating apparatus 100 includes a relational expression acquisition unit 110, a residual life estimating unit 120, and a storage 130. Relational expression data 131 and energy storage device data 132 are stored in the storage 130.

The relational expression acquisition unit 110 acquires a relational expression. In the relational expression, a resistance value of a DC resistance or an AC resistance of the energy storage device 200 at an accumulated use period elapsed time point that is of an accumulated value of a use period of the energy storage device 200 is given by an expression including a term of an Nth-degree function (N≥3) or an exponential function of an accumulated use period. Specifically, in the embodiment, the relational expression acquisition unit 110 acquires the relational expression in which the resistance value is given by a polynomial including the cubic function of the accumulated use period.

As used herein, the accumulated use period means a total period in which use periods of the energy storage device 200 are added up until a predetermined time point since a use starting time point of the energy storage device 200. For example, in the case that the energy storage device 200 is intermittently used, the accumulated use period means a period from which a non-use period of the energy storage device 200 is subtracted. The non-use period may not be strictly subtracted, but the whole period including the non-use period from the use starting time point of the energy storage device 200 to the predetermined time point may be used as the accumulated use period. Preferably an hour or a cycle (the number of charging and discharging times) is used as a unit of the accumulated use period, any unit may be used as long as the unit expresses a period such as a month and a day.

The resistance value of the DC resistance or AC resistance of the energy storage device 200 is a resistance value of an internal resistance of the energy storage device 200, for example, a resistance value of a DC resistance in ten seconds or a 1-kHz AC resistance. The DC resistance in ten seconds is measured by a gradient of a V-I (voltage-current) plot in ten seconds. The 1-kHz AC resistance means an AC resistance (AC impedance) that is measured by applying an AC voltage or an AC current having a frequency of 1 kHz to the energy storage device 200.

Specifically, in the case that the value in which the resistance value in the relational expression is differentiated by the accumulated use period twice becomes a positive value, the relational expression acquisition unit 110 sets the accumulated use period to the relational expression acquisition period, and acquires the relational expression obtained from the relationship between the resistance value and the accumulated use period up to the relational expression acquisition period elapsed time point. This is described in detail later.

The relational expression acquisition unit 110 acquires the relational expression by reading the relational expression from the relational expression data 131 stored in the storage 130. That is, the relational expression data 131 is data holding the relational expression estimating the residual life of the energy storage device 200. The relational expression is described in detail later.

The residual life estimating unit 120 estimates the residual life of the energy storage device 200 using the relational expression acquired by the relational expression acquisition unit 110. The residual life estimating unit 120 includes a resistance value acquisition unit 121, a period acquisition unit 122, and a residual life calculation unit 123.

The resistance value acquisition unit 121 acquires a first resistance value that is of the resistance value of the energy storage device 200 at a predetermined time point (hereinafter, referred to as a first time point). That is, the resistance value acquisition unit 121 acquires the resistance value of the energy storage device 200 at the first time point by, for example, measurement, and uses the acquired resistance value as a first resistance value.

The resistance value acquisition unit 121 acquires a second resistance value that is of the resistance value at the life expiration time point (hereinafter, referred to as a second time point) of the energy storage device 200. That is, the resistance value acquisition unit 121 acquires a value, which is fixed by a user, from a user input as the resistance value at the life expiration time point of the energy storage device 200, and uses the acquired value as the second resistance value.

The resistance value acquisition unit 121 stores the acquired first and second resistance values in the energy storage device data 132 of the storage 130. The energy storage device data 132 stored in the storage 130 is described in detail later.

The period acquisition unit 122 acquires the first accumulated use period that is of the accumulated use period in the first resistance value obtained from the relational expression. That is, the period acquisition unit 122 calculates the accumulated use period in the first resistance value acquired by the resistance value acquisition unit 121 using the relational expression acquired by the relational expression acquisition unit 110, thereby acquiring the first accumulated use period that is of the accumulated use period at the first time point.

The period acquisition unit 122 also acquires the second accumulated use period that is of the accumulated use period in the second resistance value obtained from the relational expression. That is, the period acquisition unit 122 calculates the accumulated use period in the second resistance value acquired by the resistance value acquisition unit 121 using the relational expression acquired by the relational expression acquisition unit 110, thereby acquiring the second accumulated use period that is of the accumulated use period at the second time point.

The period acquisition unit 122 reads the first and second resistance values from the energy storage device data 132 stored in the storage 130, and acquires the first and second accumulated use periods by calculating the first and second accumulated use periods using the relational expression. The period acquisition unit 122 stores the acquired first and second accumulated use periods in the energy storage device data 132.

The residual life calculation unit 123 calculates the residual life of the energy storage device 200 from the first time point by subtracting the first accumulated use period from the second accumulated use period, the first and second accumulated use periods being acquired by the period acquisition unit 122. Specifically, the residual life calculation unit 123 reads the first and second accumulated use periods from the energy storage device data 132 stored in the storage 130, and calculates the residual life.

That is, the residual life is the usable accumulated use period of the energy storage device 200 from the predetermined time point (first time point) to the life expiration time point (second time point).

Figures 3, 4:
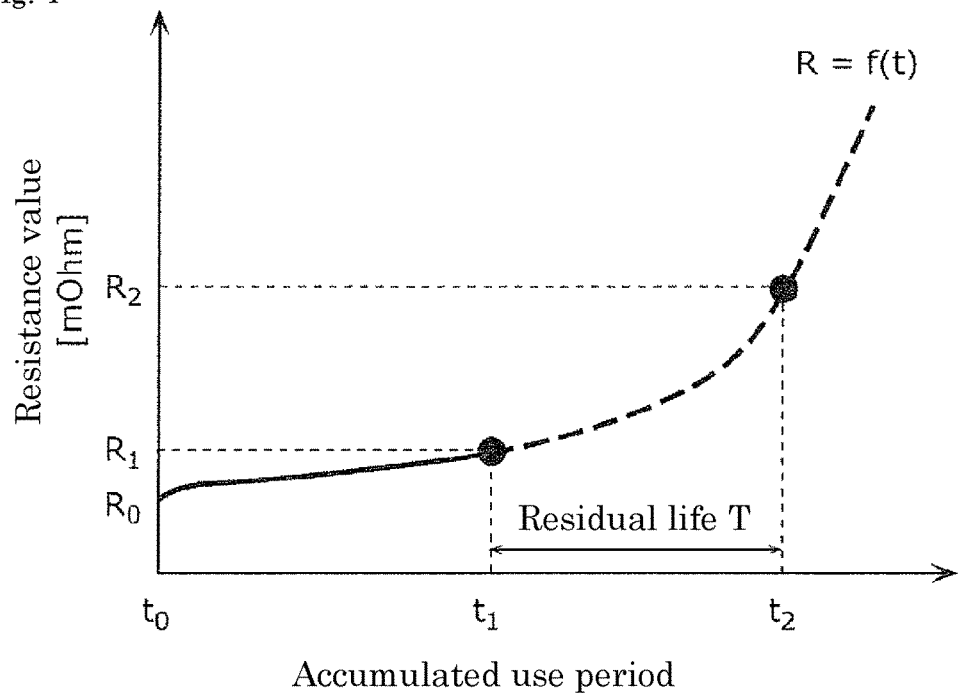
FIG. 3 is a view illustrating an example of energy storage device data according to the embodiment of the present invention.
FIG. 4 is a view illustrating a relational expression acquired by a relational expression acquisition unit according to the embodiment of the present invention.

FIG. 3 is a view illustrating an example of the energy storage device data 132 according to the embodiment of the present invention.

The energy storage device data 132 is a set of pieces of data indicating the resistance value of the energy storage device 200 at a certain time point and the accumulated use period of the energy storage device 200 at the certain time point.

As illustrated in FIG. 3, the energy storage device data 132 is a data table in which the "resistance value" and the "accumulated use period" are correlated with each other. The value indicating the resistance value of the energy storage device 200 at a certain time point such as the first time point and the second time point is stored in the "resistance value". The value indicating the accumulated use period of the energy storage device 200 at the certain time point is stored in the "accumulated use period".

The relational expression acquired by the relational expression acquisition unit 110 will be described in detail below.

FIG. 4 is a view illustrating the relational expression acquired by the relational expression acquisition unit 110 according to the embodiment of the present invention. Specifically, FIG. 4 is a graph illustrating a relationship between the resistance value and accumulated use period of the energy storage device 200.

Figure 5A:
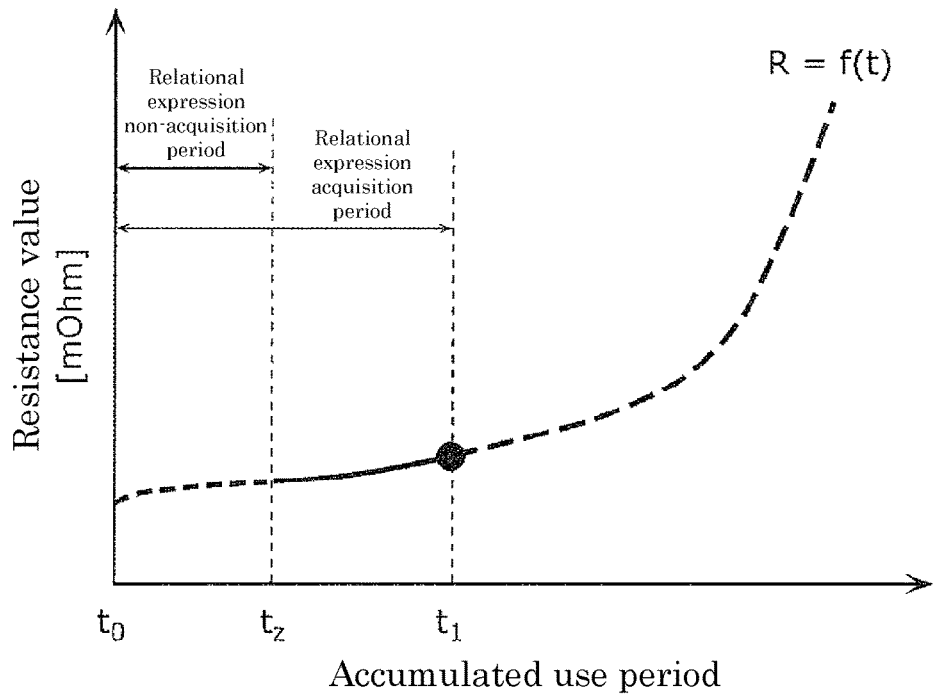
FIG. 5A is a view illustrating a period necessary to obtain the relational expression acquired by the relational expression acquisition unit according to the embodiment of the present invention.
Figure 5B:
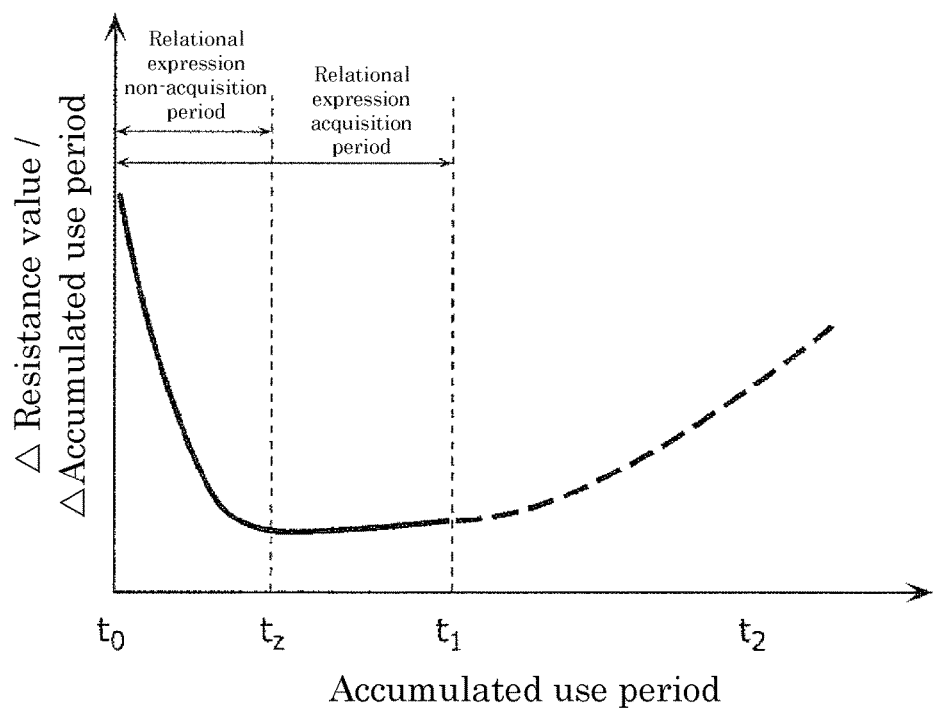
FIG. 5B is a view illustrating a period necessary to obtain the relational expression acquired by the relational expression acquisition unit according to the embodiment of the present invention.

FIGS. 5A and 5B are views illustrating a period necessary to obtain the relational expression acquired by the relational expression acquisition unit 110 according to the embodiment of the present invention. Specifically, FIGS. 5A and 5B are graphs illustrating a relational expression non-acquisition period during which the relational expression cannot be obtained and a relational expression acquisition period during which the relational expression can be obtained.

In the graph of FIG. 5B, vertical axis indicates a value in which the resistance value of the graph in FIG. 5A is differentiated by the accumulated use period once.

As illustrated in FIG. 4, the relational expression can be acquired through the relational expression acquisition unit 110 by performing the following experiment. Specifically, a polynomial R=f(t) including the cubic function is calculated from a transition ($R_0$ to $R_1$) of the resistance value R of the DC resistance or AC resistance up to a certain degradation state (for example, a period of $t_0$ to $t_1$ in FIG. 4) on a use condition (a current value is a specified value) that repetitive use is assumed.

For example, after 0, 100, 200, and 300 cycles, the DC or AC resistance is measured to acquire a data pair of (resistance value R and accumulated use period t). The relationship between the both is substituted in $R=A \times t^3+B \times t^2+C \times t+D$ to calculate the constants A, B, C, and D.

The following method can be cited as an example of a method for measuring the resistance value R. After the recovered battery is left at 25° C. for at least three hours, constant current discharge (residual discharge) is performed with a battery rated capacity of 0.05 CA until SOC (State Of Charge) becomes 0%.

There is no limitation to the method for acquiring the resistance value R of the DC resistance. For example, after constant-current constant-voltage charge is performed with the battery rated capacity of 0.2 CA until SOC becomes 50% for 8 hours in total, 10-second voltage (V) of the discharge current at least 3 points such as 0.2, 0.5, and 1 CA is plotted with respect to each discharge current (I), linearity of a gradient of the V-I plot is checked, and the resistance value R of the DC resistance is acquired from the gradient of the V-I plot.

In the case that the resistance value R of the AC resistance is acquired, a 1-kHz internal impedance (for example, SOC of 0%) of the battery is acquired with an AC impedance measurement instrument.

Therefore, the relational expression in which the resistance value R is given by the polynomial including the cubic function of the accumulated use period t is acquired as illustrated in Equation 1.

$$R=f(t)=A \times t^3+B \times t^2+C \times t+D \qquad \text{(Equation 1)}$$

Where A, B, C, and D are constants. The relational expression acquisition unit 110 can obtain the relational expression as illustrated in Equation 1. In the relational expression, the resistance value R of the DC resistance or AC resistance of the energy storage device 200 at the accumulated use period elapsed time point that is of the accumulated value of the use period of the energy storage device 200 is given by the polynomial including the cubic function of the accumulated use period t.

The graph given by Equation 1 is one in which the resistance value R increases rapidly with the passage of the accumulated use period t at an end of life of the battery, and the graph can correctly express the degradation state of the battery in which the resistance value R increases exponentially at the end of life of the battery. As used herein, for example, the end of life of the battery means the case that an internal resistance of the battery becomes at least triple an initial state of the internal resistance.

The relational expression of Equation 1 is previously derived by the experiment in each kind of the energy storage device 200, and previously stored in the relational expression data 131 of the storage 130.

In Equation 1, the constants A, B, C, and D are calculated in each kind of the energy storage device 200.

As illustrated in FIG. 5A, in an accumulated use period $t_0$ to $t_Z$, because the graph of the change in resistance value with respect to the accumulated use period becomes the function convex upward (concave function), the cubic function cannot be obtained only from the graph of the function convex upward. The accumulated use period $t_0$ to $t_Z$ in which the cubic function cannot be obtained is referred to as a relational expression non-acquisition period.

That is, as illustrated in FIG. 5B, the relational expression non-acquisition period is one during which the change of the value in which the resistance value is differentiated by the accumulated use period once decreases (a gradient of a tangent becomes negative) with respect to the accumulated use period. More specifically, the relational expression non-acquisition period is one during which the value in which the resistance value is differentiated by the accumulated use period twice becomes negative.

In FIG. 5B, the value in which the resistance value is differentiated by the accumulated use period once is calculated as an amount of change of the resistance value in an accumulated use period $t_a$ to $t_b$, and a horizontal axis is set to an average value of the accumulated use period $t_a$ to $t_b$, which allows the generation of the simplified graph.

In the accumulated use period $t_0$ to $t_1$, because the graph of the change in resistance value with respect to the accumulated use period becomes the function convex downward (convex function) in the accumulated use period $t_Z$ to $t_1$, the cubic function can be obtained only from the graph of the function convex downward.

The accumulated use period $t_0$ to $t_1$ in which the cubic function can be obtained is referred to as a relational expression acquisition period.

That is, the relational expression acquisition period is one during which the change of the value in which the resistance value is differentiated by the accumulated use period once increases (the gradient of the tangent becomes positive) with respect to the accumulated use period. More specifically, the relational expression acquisition period is one during which the value in which the resistance value is differentiated by the accumulated use period twice becomes positive.

Thus, in the case that the value in which the resistance value in the relational expression is differentiated by the accumulated use period twice becomes a positive value, the relational expression acquisition unit 110 sets the accumulated use period to the relational expression acquisition period and acquires the relational expression obtained from the relationship between the resistance value and the accumulated use period up to the relational expression acquisition period elapsed time point.

Alternatively, a value approximate to the second-order differential value, which is calculated in a simplified manner using an average value of the accumulated use period $t_a$ to $t_b$, may be used as the value in which the resistance value is differentiated by the accumulated use period twice.

At this point, in the relational expression non-acquisition period, the resistance value for the accumulated use period can be predicted by a known method such as the root law and the linear law.

Therefore, the relational expression calculated by the known method is stored in the relational expression data 131 of the storage 130, and the relational expression acquisition unit 110 may acquire the relational expression in the relational expression non-acquisition period.

The processing in which the life estimating apparatus 100 estimates the residual life of the energy storage device 200 will be described below.

Figure 6:
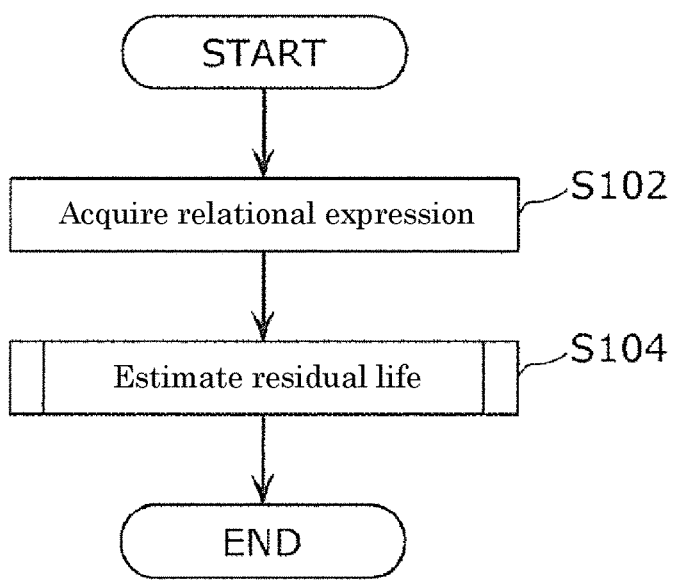
FIG. 6 is a flowchart illustrating an example in which the life estimating apparatus according to the embodiment of the present invention performs a processing of estimating a residual life of an energy storage device.
Figure 7:
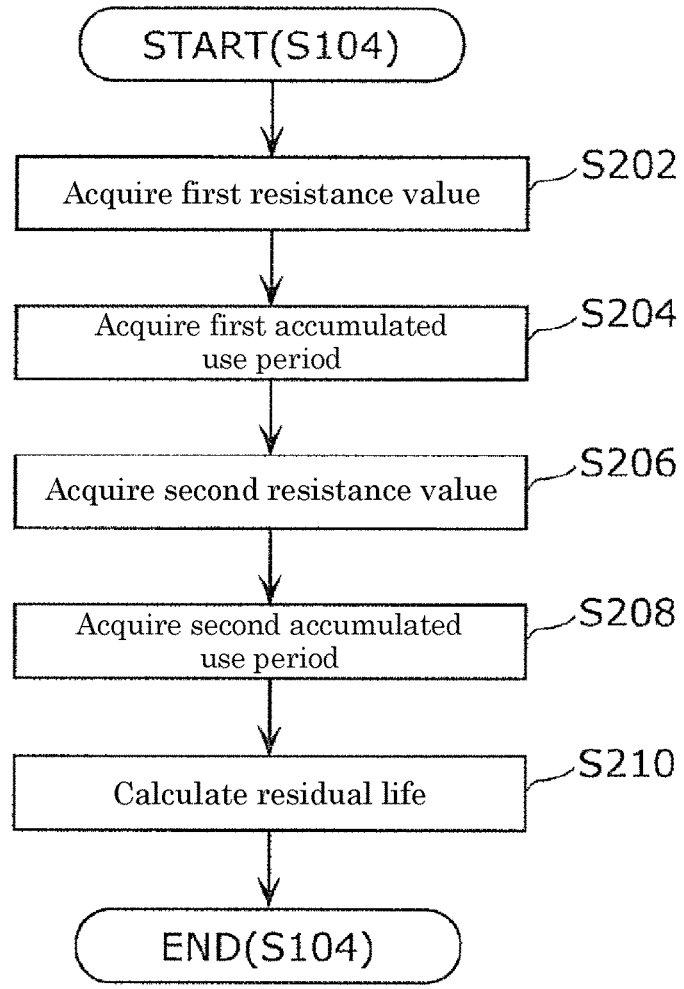
FIG. 7 is a flowchart illustrating an example in which the life estimating apparatus according to the embodiment of the present invention performs the processing of estimating the residual life of the energy storage device.

FIGS. 6 and 7 are flowcharts illustrating an example in which the life estimating apparatus 100 according to the embodiment of the present invention performs the processing of estimating the residual life of the energy storage device 200.

As illustrated in FIG. 6, the relational expression acquisition unit 110 acquires the relational expression given by Equation 1 according to the kind of the energy storage device 200 estimating the residual life (S102). Specifically, the relational expression acquisition unit 110 acquires the relational expression according to the kind of the energy storage device 200 by referring to the relational expression data 131 stored in the storage 130. The relational expression obtained from the relationship between the resistance value and the accumulated use period up to the relational expression acquisition period elapsed time point is previously written in the relational expression data 131.

For example, the relational expression calculated by a known method such as the root law and the linear law is previously written in the relational expression data 131 in the relational expression non-acquisition period, and the cubic function of Equation 1 is previously written in the relational expression data 131 in the relational expression acquisition period after the relational expression non-acquisition period. The relational expression acquisition unit 110 acquires the relational expression by the known method in the relational expression non-acquisition period, and acquires the cubic function of Equation 1 in the relational expression acquisition period after the relational expression non-acquisition period.

The residual life estimating unit 120 estimates the residual life of the energy storage device 200 using the relational expression acquired by the relational expression acquisition unit 110 (S104). The residual life estimating processing performed by the residual life estimating unit 120 will be described in detail below. FIG. 7 is a flowchart illustrating an example of the residual life estimating processing (S104 in FIG. 6) performed by the residual life estimating unit 120 according to the embodiment of the present invention.

As illustrated in FIG. 7, the resistance value acquisition unit 121 acquires the first resistance value of the energy storage device 200 at the first time point (S202). Specifically, as illustrated in FIG. 4, the resistance value acquisition unit 121 acquires a first resistance value $R_1$ by measuring the first resistance value $R_1$ of the energy storage device 200 at the first time point. The resistance value acquisition unit 121 may acquire the first resistance value $R_1$ from the outside such as the user input. The resistance value acquisition unit 121 stores the acquired first resistance value $R_1$ in the energy storage device data 132 of the storage 130.

Referring to FIG. 7, the period acquisition unit 122 acquires the first accumulated use period that is of the accumulated use period in the first resistance value obtained from the relational expression. Specifically, as illustrated in FIG. 4, the period acquisition unit 122 calculates a first accumulated use period $t_1$ by substituting the first resistance value $R_1$ acquired by the resistance value acquisition unit 121 in the relational expression (the graph in FIG. 4) acquired by the relational expression acquisition unit 110. For example, the period acquisition unit 122 calculates the first accumulated use period $t_1$ from the relational expression given by Equation 1 using a function expression $R=f(t)$ in which the polynomial including the cubic function is used.

The period acquisition unit 122 reads the first resistance value $R_1$ from the energy storage device data 132 stored in the storage 130, calculates the first accumulated use period $t_1$ using the relational expression, and stores the first accumulated use period $t_1$ in the energy storage device data 132.

Referring to FIG. 7, the resistance value acquisition unit 121 acquires the second resistance value of the energy storage device 200 at the second time point (life expiration time point) of the energy storage device 200 (S206). Specifically, as illustrated in FIG. 4, the resistance value acquisition unit 121 acquires a second resistance value $R_2$, which is fixed by a user, from the user input as the resistance value at the life expiration time point of the energy storage device 200. As used herein, for example, the life expiration time point of the energy storage device 200 means the case that the internal resistance of the energy storage device 200 becomes at least triple the initial state of the internal resistance. The resistance value acquisition unit 121 stores the acquired second resistance value $R_2$ in the energy storage device data 132 of the storage 130.

Alternatively, the second resistance value $R_2$ is previously set and stored in the storage 130, and the resistance value acquisition unit 121 may acquire the second resistance value $R_2$ from the storage 130. The resistance value acquisition unit 121 may acquire the second resistance value $R_2$ by calculating the second resistance value $R_2$ according to a predetermined rule.

Referring to FIG. 7, the period acquisition unit 122 acquires the second accumulated use period that is of the accumulated use period in the second resistance value obtained from the relational expression (S208). Specifically, as illustrated in FIG. 4, the period acquisition unit 122 calculates a second accumulated use period $t_2$ by substituting the second resistance value $R_2$ acquired by the resistance value acquisition unit 121 in the relational expression (the graph in FIG. 4) acquired by the relational expression acquisition unit 110. For example, the period acquisition unit 122 calculates the second accumulated use period $t_2$ using $t_2=f^{-1}(R_2)$ similarly to the calculation of the first accumulated use period $t_1$.

The period acquisition unit 122 reads the second resistance value $R_2$ from the energy storage device data 132 stored in the storage 130, calculates the second accumulated use period $t_2$ using the relational expression, and stores the second accumulated use period $t_2$ in the energy storage device data 132. Alternatively, the second accumulated use period $t_2$ is previously stored in the energy storage device data 132, and the period acquisition unit 122 may acquire the second accumulated use period $t_2$ from the energy storage device data 132.

Referring to FIG. 7, the residual life calculation unit 123 calculates the residual life of the energy storage device 200 from the first time point by subtracting the first accumulated use period from the second accumulated use period (S210).

Specifically, as illustrated in FIG. 4, the residual life calculation unit 123 reads a first accumulated use period $t_1$ and a second accumulated use period $t_2$ from the energy storage device data 132 stored in the storage 130, and calculates the residual life T $(=t_2-t_1)$.

The processing in which the life estimating apparatus 100 estimates the residual life of the energy storage device 200 is ended.

The effect obtained by the life estimating apparatus 100 according to the embodiment of the present invention will be described below.

That the life estimating apparatus 100 correctly estimates the residual life of the energy storage device 200 will specifically be described.

The lithium-ion secondary battery used in the following specific example includes a positive electrode, a negative electrode, and a nonaqueous electrolyte. A positive mixture is formed on an aluminum foil of the positive collector, thereby constructing the positive electrode. The positive mixture contains the positive active material, polyvinylidene fluoride as a binding agent, and acetylene black as a conductive material. The positive active material is a mixture of layered-structure lithium transition metal oxide expressed by $LiNi_{1/3}Co_{1/3}Mn_{1/3}O_2$ and spinel type lithium manganese oxide. A negative mixture is formed on a copper foil of the negative collector, thereby constructing the negative electrode. The negative mixture contains graphite carbon material as the negative active material and polyvinylidene fluoride as the binding agent.

There is no particular limitation to a mixture ratio of layered-structure lithium transition metal oxide and spinel type lithium manganese oxide in the positive active material, and a similar result is obtained even if the positive active material is made with any mixture ratio.

During a 45° C., 1C cycle test, the charge was performed by the constant-current constant-voltage charge at 45° C., a current of 1 CmA (=650 mA), a voltage of 4.1 V, and charging time of 3 hours, and the discharge was performed by the constant-current discharge at 45° C., a current of 1 CmA (=650 mA), and a termination voltage of 2.75 V. A quiescent time was provided for 10 minutes between the charge and the discharge and between the discharge and the charge. The quiescent time was provided by putting the battery into an opened-circuit state. That is, one cycle is constructed with four processes of the charge, the quiescent, the discharge, and the quiescent.

During a capacity evaluation test, the charge was performed by the constant-current constant-voltage charge at 25° C., a current of 1 CmA (=650 mA), a voltage of 4.1 V, and a charging time of 3 hours, and the discharge was performed by the constant-current discharge at 25° C., a current of 1 CmA (=650 mA), and a termination voltage of 2.75 V. A quiescent time was provided for 10 minutes between the charge and the discharge and between the discharge and charge.

FIGS. 8A to 11 are views illustrating the effect obtained by the life estimating apparatus 100 according to the embodiment of the present invention.

Figure 8A:
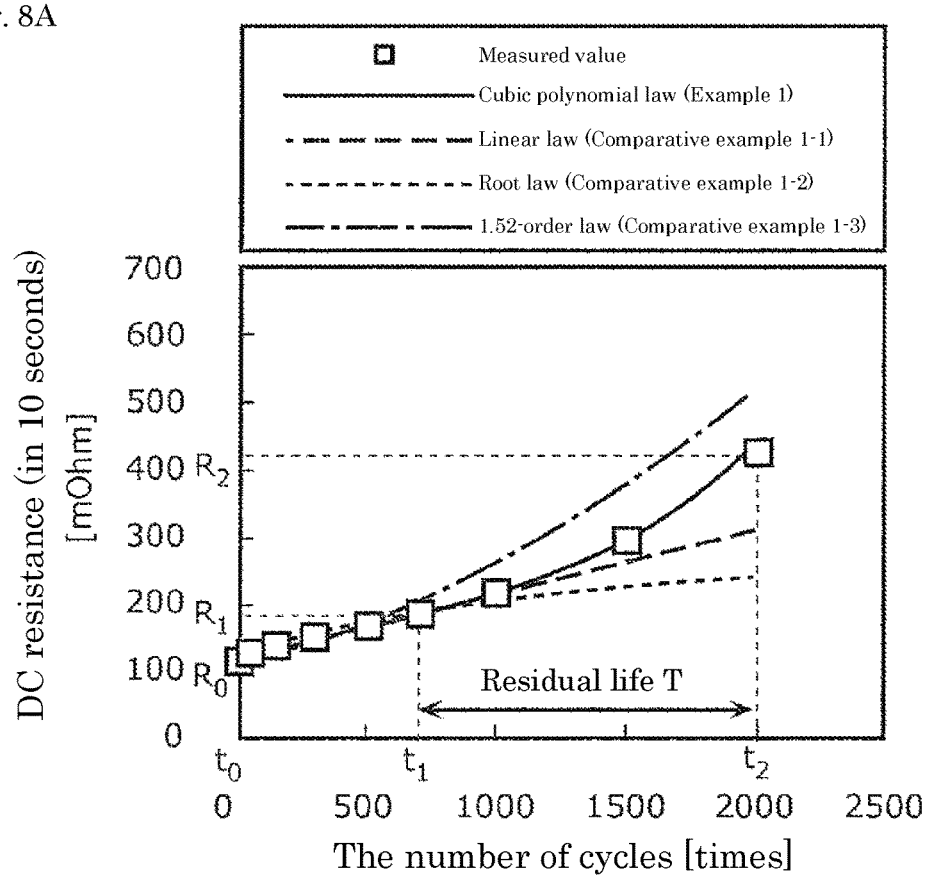
FIG. 8A is a view illustrating an effect obtained by the life estimating apparatus according to the embodiment of the present invention using a graph of a DC resistance and the number of cycles.
Figure 8B:
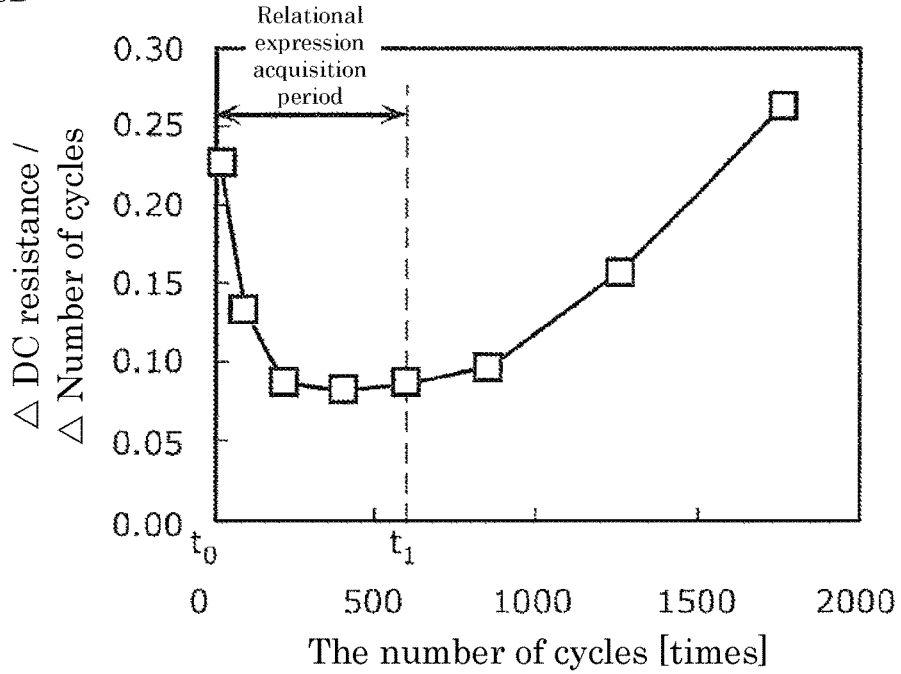
FIG. 8B is a view illustrating a relational expression acquisition period in the relational expression acquired by the relational expression acquisition unit according to the embodiment of the present invention.
Figures 9, 10A:
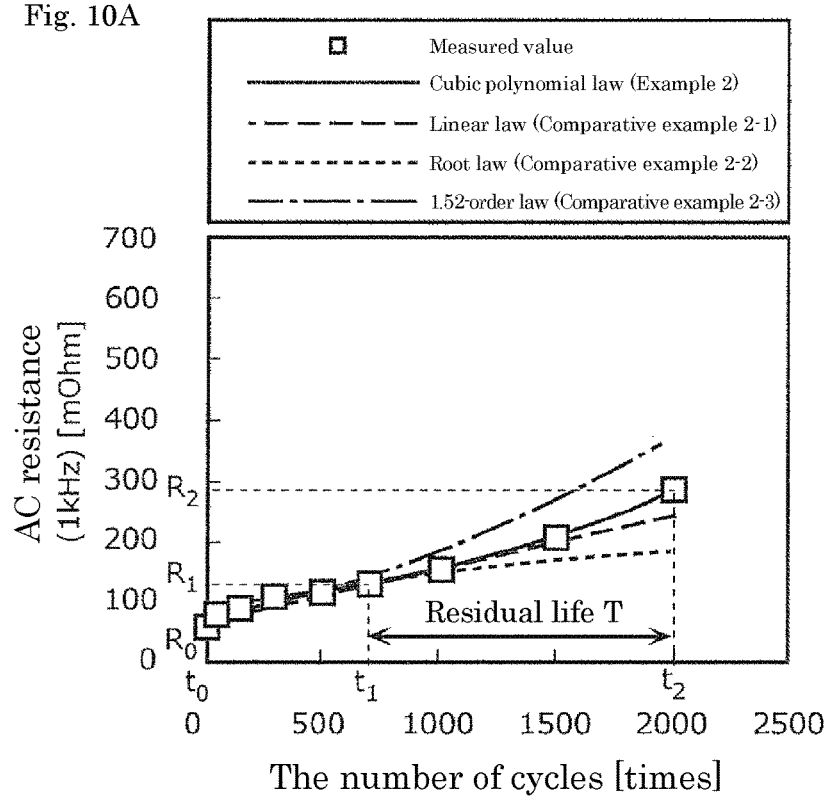
FIG. 9 is a view illustrating the effect obtained by the life estimating apparatus according to the embodiment of the present invention in comparison with a comparative example.
FIG. 10A is a view illustrating the effect obtained by the life estimating apparatus according to the embodiment of the present invention using a graph of an AC resistance and the number of cycles.

Firstly the effect will be described with reference to FIGS. 8A to 9. FIGS. 8A to 9 are views illustrating the effect obtained by the life estimating apparatus 100 when the resistance value R is the DC resistance. Specifically, FIG. 8A is a view illustrating the effect obtained by the life estimating apparatus 100 according to the embodiment of the present invention using a graph of the DC resistance and the number of cycles. FIG. 8B is a view illustrating the relational expression acquisition period in the relational expression acquired by the relational expression acquisition unit 110 according to the embodiment of the present invention. FIG. 9 is a view illustrating the effect obtained by the life estimating apparatus 100 according to the embodiment of the present invention in comparison with a comparative example.

As illustrated in FIG. 8A, the 45° C., 1C cycle test was performed on the target battery to calculate relational expression given by Equation 1. Specifically, the relational expression R=f(t) given by the polynomial including the cubic function was calculated from a transition ($R_0$ to $R_1$) of the resistance value R of the DC resistance in a range of 0 cycle ($t_0$ in FIG. 8A) to 700 cycles ($t_1$ in FIG. 8A).

As illustrated in FIG. 8B, the value in which the resistance value is differentiated by the accumulated use period twice becomes positive in the accumulated use period $t_1$ (700 cycles) (the gradient of the tangent becomes positive in FIG. 8A). Therefore, the accumulated use period $t_1$ (700 cycles) was the relational expression acquisition period, and the relational expression was calculated from the relationship between the resistance value and the accumulated use period up to the relational expression acquisition period elapsed time point ($t_0$ to $t_1$: 0 cycle to 700 cycles).

As a result, the relational expression $R=4.46\times10^{-8}\times t^3-6.95\times10^{-5}\times t^2+0.119\times t+118.8$ was obtained as shown in FIG. 9.

Because $R_1$=184.1 mOhm was obtained for $t_1$=700 cycles, the first resistance value of the battery at the first time point was set to $R_1$=184.1 mOhm, and the first accumulated use period was set to $t_1$=700 cycles. The second resistance value of the battery at the second time point (life expiration time point) was set to $R_2$=424.4 mOhm, and the second accumulated use period $t_2$ is calculated from $t_2=f^{-1}(R_2)$. As a result, the second accumulated use period $t_2$=1970 cycles was calculated.

Therefore, the residual life T was calculated as $T=t_2-t_1$=1270 cycles. At this point, because the measured value was 1300 cycles, the residual life T calculated using the relational expression R=f(t) given by the polynomial including the cubic function agreed with the measured value.

The residual life was predicted as a comparative example by a conventional method. Specifically, based on the result of the resistance values R of 0 cycle to 700 cycles, a prediction formula was obtained assuming that the relationship between the resistance value R and the number of cycles was (1) linear law, (2) root law, and (3) 1.52-order law. Each prediction formula is as follows.

$R=0.0962\times t+117.9$ (1) Linear law $R=3.13\times t^{1/2}+102.7$ (2) Root law $R=3.85\times10^{-3}\times t^{1.52}+121.5$ (3) 1.52-order law Similarly to the polynomial including the cubic function, defining $t_1$=700 cycles, $t_2$ was calculated as a life when the resistance value reaches $R_2$=424.4 mOhm, thereby calculating the residual life $T=t_2-t_1$. The calculation results of the residual life T were (1) 2486 cycles, (2) 9864 cycles, and (3) 963 cycles for (1) linear law, (2) root law, and (3) 1.52-order law, respectively.

Therefore, differences between the residual lives T and 1300 cycles of the measured value became (1) +1186 cycles, (2) +8564 cycles, and (3) −337 cycles for (1) linear law, (2) root law, and (3) 1.52-order law, respectively. As described above, the life estimating apparatus 100 of the embodiment can estimate the residual life with extremely high accuracy compared with the conventional method.

Figures 10B, 11:
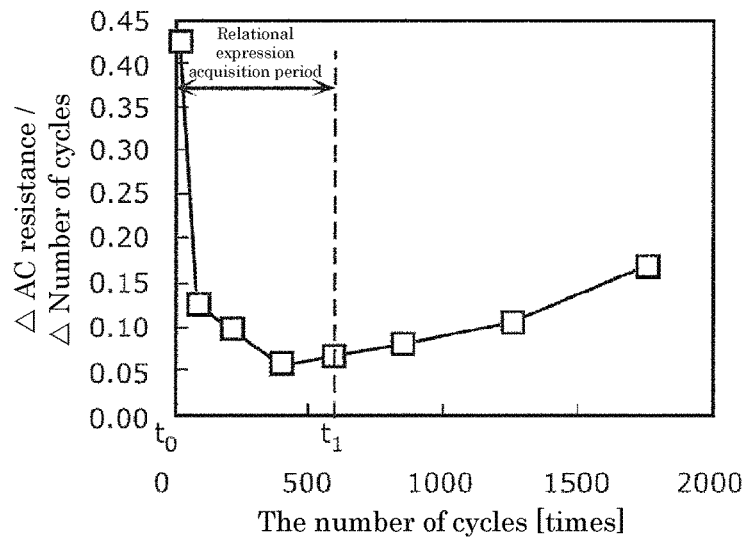
FIG. 10B is a view illustrating the relational expression acquisition period in the relational expression acquired by the relational expression acquisition unit according to the embodiment of the present invention.
FIG. 11 is a view illustrating the effect obtained by the life estimating apparatus according to the embodiment of the present invention in comparison with a comparative example.

Then the description will be made with reference to FIGS. 10A to 11. FIGS. 10A to 11 are views illustrating the effect obtained by the life estimating apparatus 100 when the resistance value R is the AC resistance. Specifically, FIG. 10A is a view illustrating the effect obtained by the life estimating apparatus 100 according to the embodiment of the present invention using a graph of the AC resistance and the number of cycles. FIG. 10B is a view illustrating the relational expression acquisition period in the relational expression acquired by the relational expression acquisition unit 110 according to the embodiment of the present invention. FIG. 11 is a view illustrating the effect obtained by the life estimating apparatus 100 according to the embodiment of the present invention in comparison with a comparative example.

As illustrated in FIG. 10A, the 45° C., 1C cycle test was performed on the target battery to calculate relational expression given by Equation 1. Specifically, the relational expression R=f(t) given by the polynomial including the cubic function was calculated from a transition ($R_0$ to $R_1$) of the resistance value R of the AC resistance in a range of 0 cycle ($t_0$ in FIG. 10A) to 700 cycles ($t_1$ in FIG. 10A).

As illustrated in FIG. 10B, the value in which the resistance value is differentiated by the accumulated use period twice becomes positive in the accumulated use period $t_1$ (700 cycles) (the gradient of the tangent becomes positive in FIG. 10A). Therefore, the accumulated use period $t_1$ (700 cycles) was the relational expression acquisition period, and the relational expression was calculated from the relationship between the resistance value and the accumulated use period up to the relational expression acquisition period elapsed time point ($t_0$ to $t_1$: 0 cycle to 700 cycles).

As a result, the relational expression $R=5.79\times10^{-9}\times t^3+1.41\times10^{-5}\times t^2+0.0436\times t+90.4$ was obtained as shown in FIG. 11.

Because $R_1$=129.8 mOhm was obtained for $t_1$=700 cycles, the first resistance value of the battery at the first time point was set to $R_1$=129.8 mOhm, and the first accumulated use period was set to $t_1$=700 cycles. The second resistance value of the battery at the second time point (life expiration time point) was set to $R_2$=291.2 mOhm, and the second accumulated use period $t_2$ is calculated from $t_2=f^{-1}(R_2)$. As a result, the second accumulated use period $t_2$=2062 cycles was calculated.

Therefore, the residual life T was calculated as $T=t_2-t_1$=1362 cycles. At this point, because the measured value was 1300 cycles, the residual life T calculated using the relational expression R=f(t) given by the polynomial including the cubic function agreed with the measured value.

The residual life was predicted as a comparative example by a conventional method. Specifically, based on the result of the resistance values R of 0 cycle to 700 cycles, a prediction formula was obtained assuming that the relationship between the resistance value R and the number of cycles was (1) linear law, (2) root law, and (3) 1.52-order law. Each prediction formula is as follows.

$R=0.0868\times t+70.7$ (1) Linear law $R=2.94\times t^{1/2}+55.1$ (2) Root law $R=2.89\times10^{-3}\times t^{152}+75.7$ (3) 1.52-order law Similarly to the polynomial including the cubic function, defining $t_1$=700 cycles, $t_2$ was calculated as a life when the resistance value reached $R_2$=291.2 mOhm, thereby calculating the residual life $T=t_2-t_1$. The calculation results of the residual life T were (1) 1840 cycles, (2) 5749 cycles, and (3) 906 cycles for (1) linear law, (2) root law, and (3) 1.52-order law, respectively.

Therefore, differences between the residual lives T and 1300 cycles of the measured value became (1) +540 cycles, (2) +4449 cycles, and (3) −394 cycles for (1) linear law, (2) root law, and (3) 1.52-order law, respectively. As described above, the life estimating apparatus 100 of the embodiment can estimate the residual life with extremely high accuracy compared with the conventional method.

As described above, in the life estimating apparatus 100 according to the embodiment of the present invention, the relational expression in which the resistance value of the DC resistance or AC resistance of the energy storage device 200 at the accumulated use period elapsed time point is given by the Nth-degree function (N≥3) or exponential function of the accumulated use period is acquired to estimate the residual life of the energy storage device 200. At this point, the resistance value increases exponentially with passage of the accumulated use period. As a result of the study and experiment, the inventors found that the variation with time of the resistance value is given by the Nth-degree function (N≥3) or exponential function of the accumulated use period in which the accumulated use period is used as a variable. In the life estimating apparatus 100, because the relationship between the resistance value and the accumulated use period can correctly be given by the relational expression, the residual life of the energy storage device 200 can correctly be estimated.

The life estimating apparatus 100 acquires the relational expression in which the resistance value is given by the polynomial including the cubic function of the accumulated use period. As a result of the study and experiment, the inventors found that the relational expression in which the resistance value is given by the polynomial including the cubic function of the accumulated use period accurately expresses the variation with time of the resistance value. In the life estimating apparatus 100, because the relationship between the resistance value and the accumulated use period can correctly be given by the relational expression, the residual life of the energy storage device 200 can correctly be estimated.

In the case that the value in which the resistance value is differentiated by the accumulated use period twice becomes a negative value, a state in which the resistance value increases exponentially with the passage of the accumulated use period can hardly be predicted because the graph of the resistance value to the accumulated use period is expressed by a function convex upward (concave function). That is, in the case that the value in which the resistance value is differentiated by the accumulated use period twice becomes the positive value, the life estimating apparatus 100 can predict the state in which the resistance value increases exponentially with the passage of the accumulated use period by acquiring the relational expression obtained from the relationship between the resistance value and the accumulated use period up to the accumulated use period elapsed time point. Therefore, in the life estimating apparatus 100, because the relationship between the resistance value and the accumulated use period can correctly be given by the relational expression, the residual life of the energy storage device 200 can correctly be estimated.

The life estimating apparatus 100 acquires the first resistance value at the predetermined time point and the second resistance value at the life expiration time point of the energy storage device 200, acquires the first accumulated use period in the first resistance value obtained from the relational expression and the second accumulated use period in the second resistance value, and calculates the residual life of the energy storage device 200 from the predetermined time point by subtracting the first accumulated use period from the second accumulated use period. Thus, the life estimating apparatus 100 can correctly estimate the residual life of the energy storage device 200.

Preferably the energy storage device 200 is the lithium-ion secondary battery containing the layered-structure lithium transition metal oxide as the positive active material. As a result of the study and experiment, the inventors found that a degradation state can correctly be given by the relational expression when the energy storage device 200 is the lithium-ion secondary battery. Therefore, the life estimating apparatus 100 can correctly estimate the residual life of the lithium-ion secondary battery.

Particularly, the life estimating apparatus 100 can accurately estimate the residual life at the end of life of the energy storage device 200. Therefore, for example, timing to exchange the lithium-ion secondary battery for a mobile body such as an electric automobile can correctly be ascertained. In the energy storage device 200, capacity degradation is suppressed by performing charge and discharge control according to the estimated life, so that the life can be prolonged.

First Modification

A first modification of the embodiment of the present invention will be described below. In the embodiment, the relational expression acquisition unit 110 acquires the relational expression according to the kind of the energy storage device 200 by referring to the relational expression data 131 stored in the storage 130. Meanwhile, in the first modification, the relational expression acquisition unit calculates and acquires the relational expression by analyzing the variation with time of the resistance value of the energy storage device 200.

Figure 12:
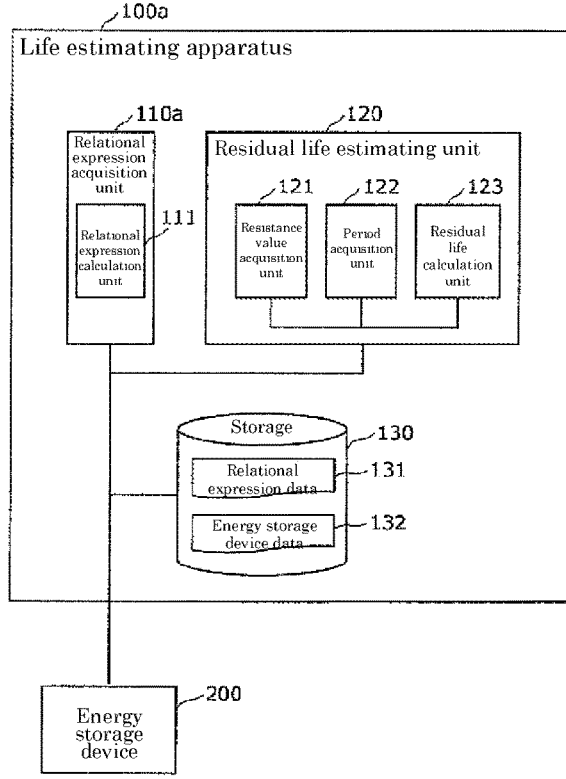
FIG. 12 is a block diagram illustrating a configuration of a life estimating apparatus according to a first modification of the embodiment of the present invention.

FIG. 12 is a block diagram illustrating a configuration of a life estimating apparatus 100a according to the first modification of the embodiment of the present invention.

As illustrated in FIG. 12, the relational expression acquisition unit 110a of a life estimating apparatus 100a included in an energy storage system 10a includes a relational expression calculation unit 111 that calculates the relational expression. The relational expression calculation unit 111 calculates the relational expression from a relationship between the resistance value and the accumulated use period up to the relational expression acquisition period elapsed time point. As used herein, the relational expression acquisition period means the accumulated use period in the case that the value in which the resistance value is differentiated by the accumulated use period twice becomes the positive value as illustrated in FIGS. 5A and 5B.

The relational expression calculation unit 111 calculates the relational expression from the relationship between the resistance value and the accumulated use period up to the relational expression acquisition period elapsed time point, which is of the accumulated use period in the case that the value in which the resistance value is differentiated by the accumulated use period twice becomes the positive value as illustrated in FIGS. 5A and 5B. The relational expression acquisition unit 110a acquires the relational expression calculated by the relational expression calculation unit 111.

Because other components included in the life estimating apparatus 100a have the functions similar to those of the components included in the life estimating apparatus 100 of the embodiment, the detailed description is omitted.

The relational expression acquiring processing performed by the relational expression acquisition unit 110a of the life estimating apparatus 100a will be described below. Because other pieces of processing are similar to the pieces of processing performed by the life estimating apparatus 100 of the embodiment, the detailed description is omitted.

Figure 13:
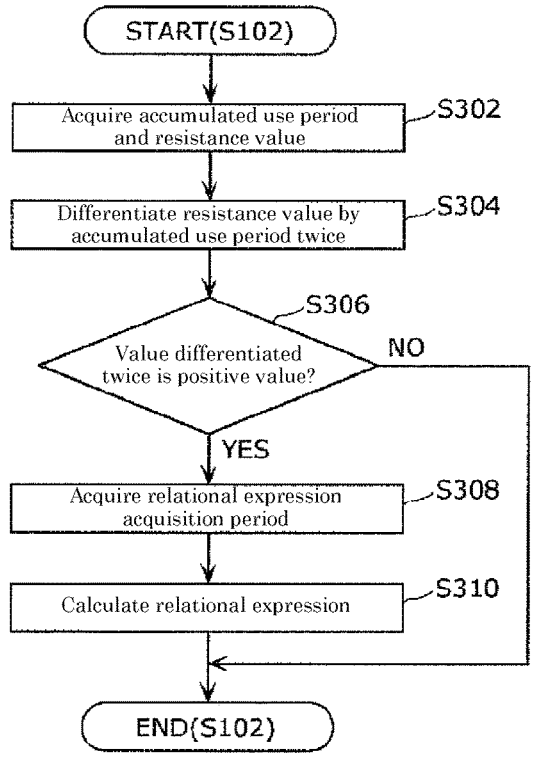
FIG. 13 is a flowchart illustrating an example in which the relational expression acquisition unit according to the first modification of the embodiment of the present invention performs relational expression acquiring processing.

FIG. 13 is a flowchart illustrating an example in which the relational expression acquisition unit 110a according to the first modification of the embodiment of the present invention performs the relational expression acquiring processing. Specifically, FIG. 13 illustrates the processing (S102 in FIG. 6) in which the relational expression acquisition unit acquires the relational expression in the processing in which the life estimating apparatus in FIG. 6 estimates the residual life of the energy storage device 200.

As illustrated in FIG. 13, the relational expression calculation unit 111 acquires the accumulated use period and resistance value of the energy storage device 200 (S302). Specifically, the relational expression calculation unit 111 acquires the accumulated use period and resistance value of the energy storage device 200 from the energy storage device 200. The relational expression calculation unit 111 writes the acquired accumulated use period and resistance value of the energy storage device 200 in the energy storage device data 132.

The relational expression calculation unit 111 differentiates the resistance value by the accumulated use period twice using the acquired accumulated use period and resistance value of the energy storage device 200 (S304). That is, the relational expression calculation unit 111 reads the accumulated use period and resistance value of the energy storage device 200 from the energy storage device data 132, and differentiates the resistance value by the accumulated use period twice. There is no particular limitation to the method of the second-order differential calculation. For example, as illustrated in FIG. 5B, the relational expression calculation unit 111 may perform the second-order differential calculation using the average value of the accumulated use period.

The relational expression calculation unit 111 determines whether the value in which the resistance value is differentiated by the accumulated use period twice is the positive value (S306). When determining that the value in which the resistance value is differentiated by the accumulated use period twice is the positive value (YES in S306), the relational expression calculation unit 111 acquires the accumulated use period as the relational expression acquisition period (S308).

The relational expression calculation unit 111 calculates the relational expression from the relationship between the resistance value and the accumulated use period up to the relational expression acquisition period elapsed time point (S310). The relational expression calculation unit 111 calculates the relational expression such that the resistance value is given by the Nth-degree function (N≥3) (specifically, the polynomial including the cubic function) of the accumulated use period. Therefore, the relational expression acquisition unit 110a can acquire the relational expression.

When determining that the value in which the resistance value is differentiated by the accumulated use period twice is not the positive value (NO in S306), the relational expression calculation unit 111 ends the processing without calculating the relational expression, and repeats the pieces of processing (S302 to S310).

Thus, the relational expression acquisition unit 110a acquires the relational expression by calculating the relational expression from the relationship between the resistance value and the accumulated use period up to the relational expression acquisition period elapsed time point. The relational expression acquisition unit 110a writes the acquired relational expression in the relational expression data 131 to store the relational expression.

Thus, the life estimating apparatus 100a according to the first modification of the embodiment of the present invention calculates the relational expression from the relationship between the resistance value and the accumulated use period up to the accumulated use period elapsed time point when the value in which the resistance value is differentiated by the accumulated use period twice becomes the positive value. The life estimating apparatus 100a can acquire the relational expression that can predict the state in which the resistance value increases exponentially with the passage of the accumulated use period without storing the relational expression in the storage 130.

Therefore, in the life estimating apparatus 100a, because the relationship between the resistance value and the accumulated use period can correctly be given by the relational expression, the residual life of the energy storage device can correctly be estimated.

In the relational expression non-acquisition period, the resistance value for the accumulated use period can be predicted by a known method such as the root law and the linear law. Therefore, in the relational expression non-acquisition period, the relational expression acquisition unit 110a may acquire the relational expression by calculating the relational expression such as the root law and the linear law by a known method.

Second Modification

A second modification of the embodiment of the present invention will be described below. In the embodiment, the relational expression acquisition unit 110 acquires the relational expression in which the resistance value of the energy storage device 200 is given by the polynomial including the cubic function of the accumulated use period. On the other hand, in the second modification, the relational expression acquisition unit 110 acquires the relational expression in which the resistance value of the energy storage device 200 is given by the expression including the term of the exponential function of the accumulated use period.

Except for the relational expression that is acquired by the relational expression acquisition unit 110 while written in the relational expression data 131, the life estimating apparatus 100 of the second modification has the configuration similar to that of the life estimating apparatus 100 of the embodiment in FIG. 2.

Except for the relational expression, each component included in the life estimating apparatus 100 of the second modification has the function similar to that of the life estimating apparatus 100 of the embodiment. Therefore, the detailed description of each component is omitted.

The relational expression acquired by the relational expression acquisition unit 110 will be described in detail below.

The relational expression can be acquired through the relational expression acquisition unit 110 by performing the following experiment. Specifically, an exponential correlation function expression $R=f(t)$ is calculated from the transition of the resistance value R of the DC resistance or AC resistance up to a certain degradation state (for example, a period of $t_0$ to $t_1$ in FIG. 4) on a use condition (a current value is a specified value) that repetitive use is assumed.

For example, after 0, 100, 200, and 300 cycles, the DC or AC resistance is measured to acquire a data pair of (resistance value R and accumulated use period t). The relationship between the both is substituted in $Ln(R)=a \times t+b$ to calculate the constants a and b. The measurement method similar to the method in FIG. 4 can be used as the method for measuring the resistance value R.

Therefore, the relational expression in which the resistance value R is given by the exponential function of the accumulated use period t is acquired as illustrated in Equation 2 below.

$$R=f(t)=c \times \exp(a \times t) \quad \text{(Equation 2)}$$

Where a and c are constants. The relational expression acquisition unit 110 can obtain the relational expression as illustrated in Equation 2. In the relational expression, the resistance value R of the DC resistance or AC resistance of the energy storage device 200 at the accumulated use period elapsed time point that is of the accumulated value of the use period of the energy storage device 200 is proportional to the exponential function, in which a value in which the predetermined constant a is multiplied by the accumulated use period t is used as a variable.

The graph given by Equation 2 is one in which the resistance value R increases rapidly with the passage of the accumulated use period t at an end of life of the battery, and the graph can correctly express the degradation state of the battery in which the resistance value R increases exponentially at the end of life of the battery. As used herein, for example, the end of life of the battery means the case that an internal resistance of the battery becomes at least triple an initial state of the internal resistance.

The relational expression of Equation 2 is previously derived by the experiment in each kind of the energy storage device 200, and previously stored in the relational expression data 131 of the storage 130.

In Equation 2, the constants a and c are calculated in each kind of the energy storage device 200.

In the processing in which the life estimating apparatus 100 estimates the residual life of the energy storage device 200, the relational expression acquisition unit 110 acquires the relational expression given by Equation 2 (S102 in FIG. 6). That is, the relational expression acquisition unit 110 acquires the relational expression, in which the resistance value of the energy storage device 200 is proportional to the exponential function having the variable in which the accumulated use period is multiplied by the predetermined constant. Specifically, the relational expression acquisition unit 110 acquires the relational expression according to the kind of the energy storage device 200 by referring to the relational expression data 131 stored in the storage 130.

Similarly to the relational expression acquisition unit 110a of the first modification, the relational expression acquisition unit 110 may calculate and acquire the relational expression by analyzing the variation with time of the resistance value of the energy storage device 200. The relational expression acquisition unit 110 may acquire the relational expression by calculating the relational expression, in which the resistance value is proportional to the exponential function having the variable in which the accumulated use period is multiplied by the predetermined constant.

In the second modification, because the relational expression non-acquisition period does not exist unlike the embodiment, it is not necessary for the relational expression acquisition unit 110 to acquire the different relational expression in the relational expression non-acquisition period.

The residual life estimating unit 120 estimates the residual life of the energy storage device 200 using the relational expression acquired by the relational expression acquisition unit 110 (S104 in FIG. 6). The residual life estimating processing performed by the residual life estimating unit 120 is similar to the processing of the embodiment in FIG. 7.

The effect obtained by the life estimating apparatus 100 according to the second modification will be described below. That the life estimating apparatus 100 correctly estimates the residual life of the energy storage device 200 will specifically be described.

The lithium-ion secondary battery (battery A and battery B) used in the following specific example includes a positive electrode, a negative electrode, and a nonaqueous electrolyte. A positive mixture is formed on an aluminum foil of the positive collector, thereby constructing the positive electrode. The positive mixture contains the positive active material, polyvinylidene fluoride as a binding agent, and acetylene black as a conductive material. The positive active material is a mixture of layered-structure lithium transition metal oxide expressed by $LiNi_{1/3}Co_{1/3}Mn_{1/3}O_2$ and spinel type lithium manganese oxide. A negative mixture is formed on a copper foil of the negative collector, thereby constructing the negative electrode. The negative mixture contains graphite carbon material as the negative active material and polyvinylidene fluoride as the binding agent. The battery A and the battery B differ from each other in a particle diameter and a specific surface area of the positive active material.

Figure 14:
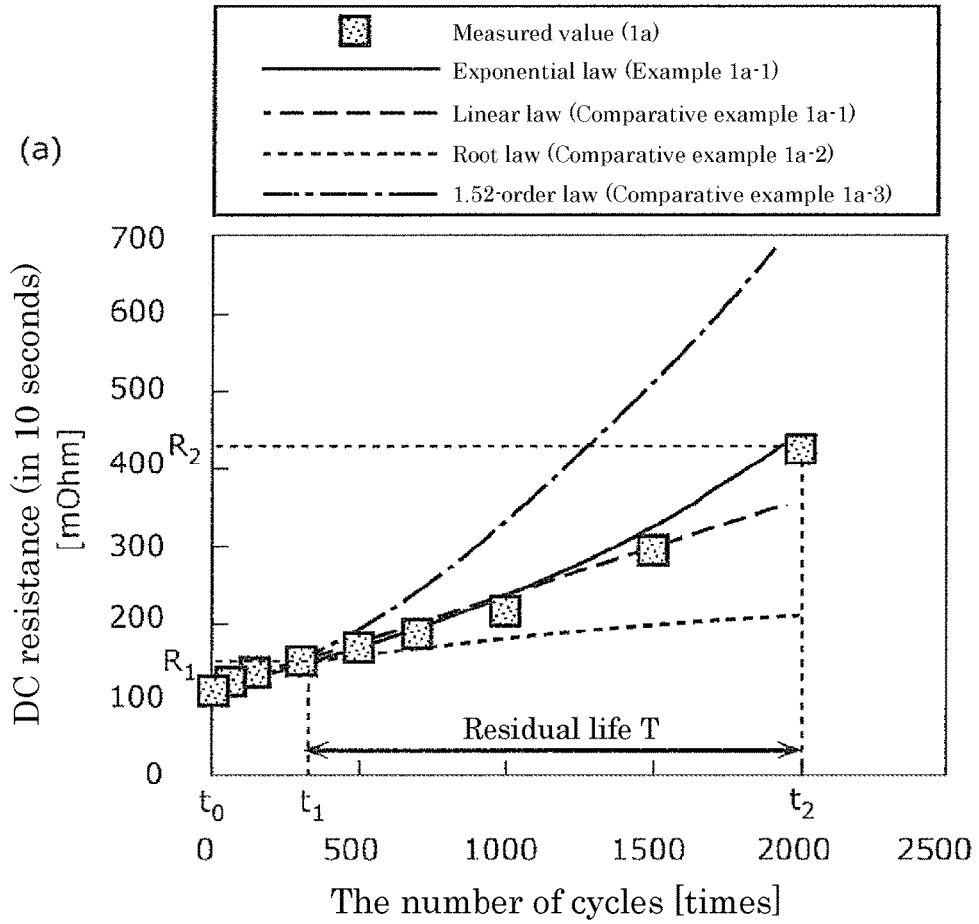
FIGS. 14A and 14B are views illustrating an effect obtained in a case where a life estimating apparatus according to a second modification of the embodiment of the present invention is a battery A and a DC resistance.
Figure 15:
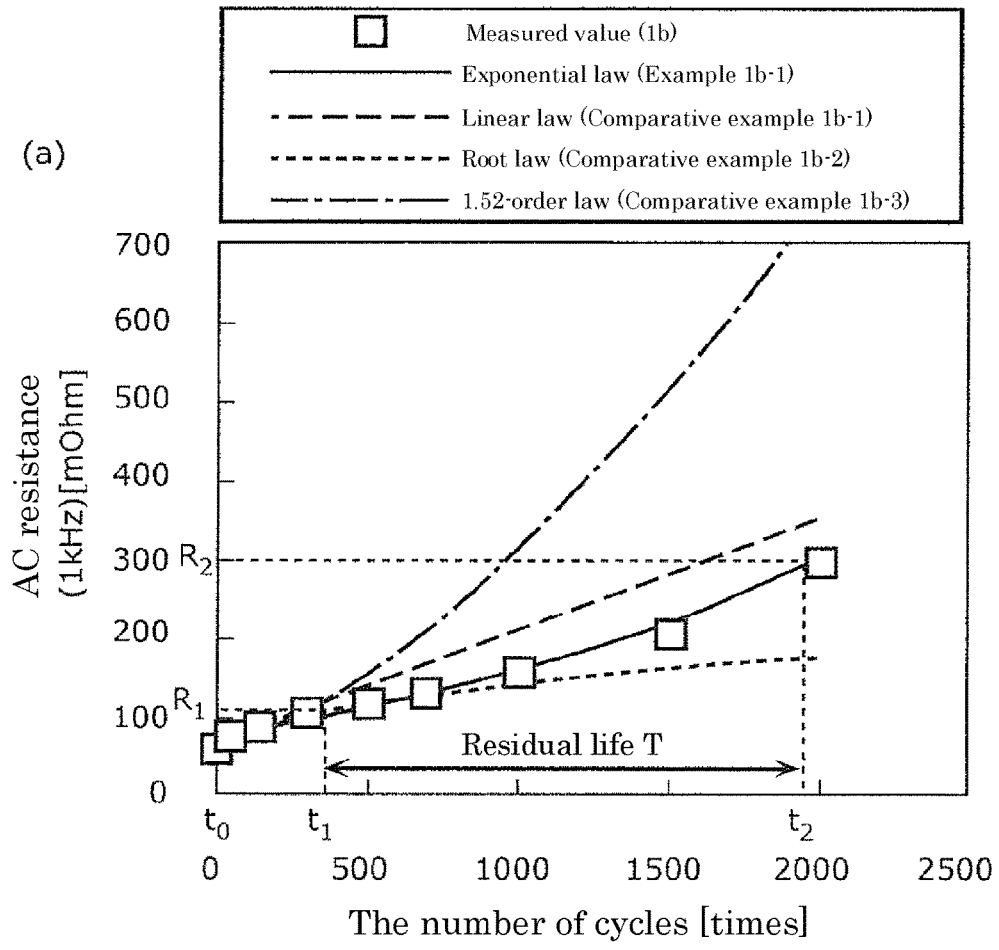
FIGS. 15A and 15B are views illustrating an effect obtained in a case where the life estimating apparatus according to the second modification of the embodiment of the present invention is the battery A and an AC resistance.
Figure 15:
Figure 16:
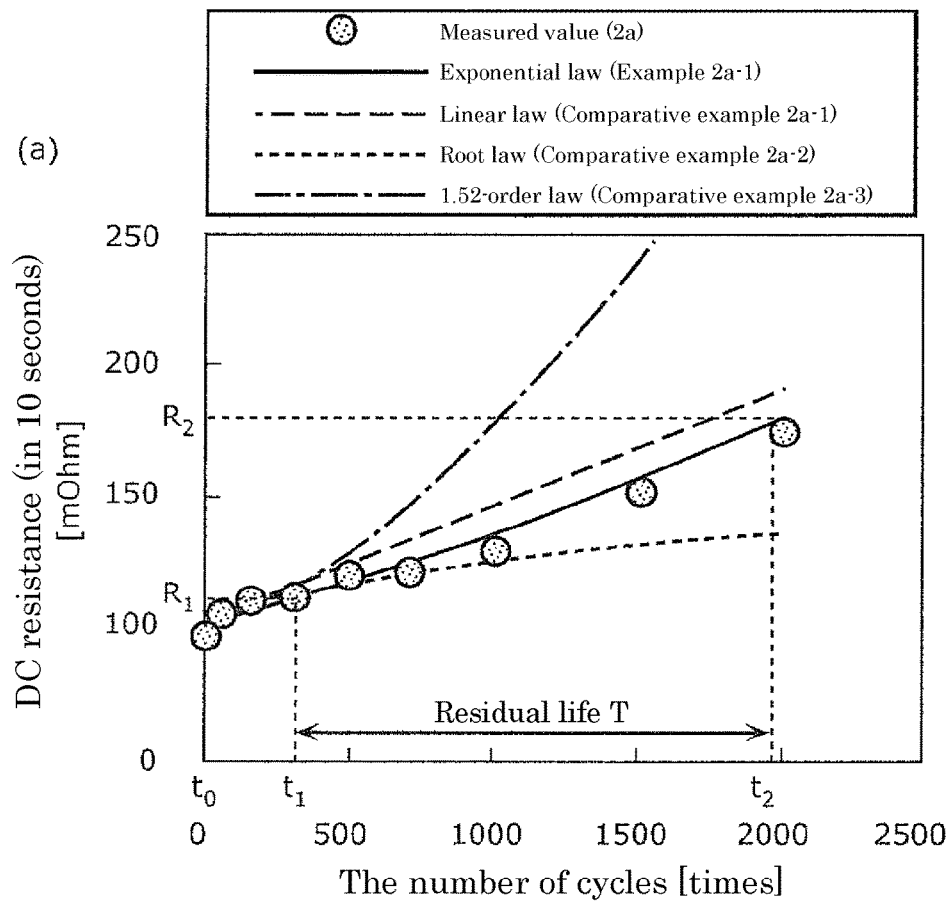
FIGS. 16A and 16B are views illustrating an effect obtained in a case where the life estimating apparatus according to the second modification of the embodiment of the present invention is a battery B and the DC resistance.
Figure 16:
Figure 17:
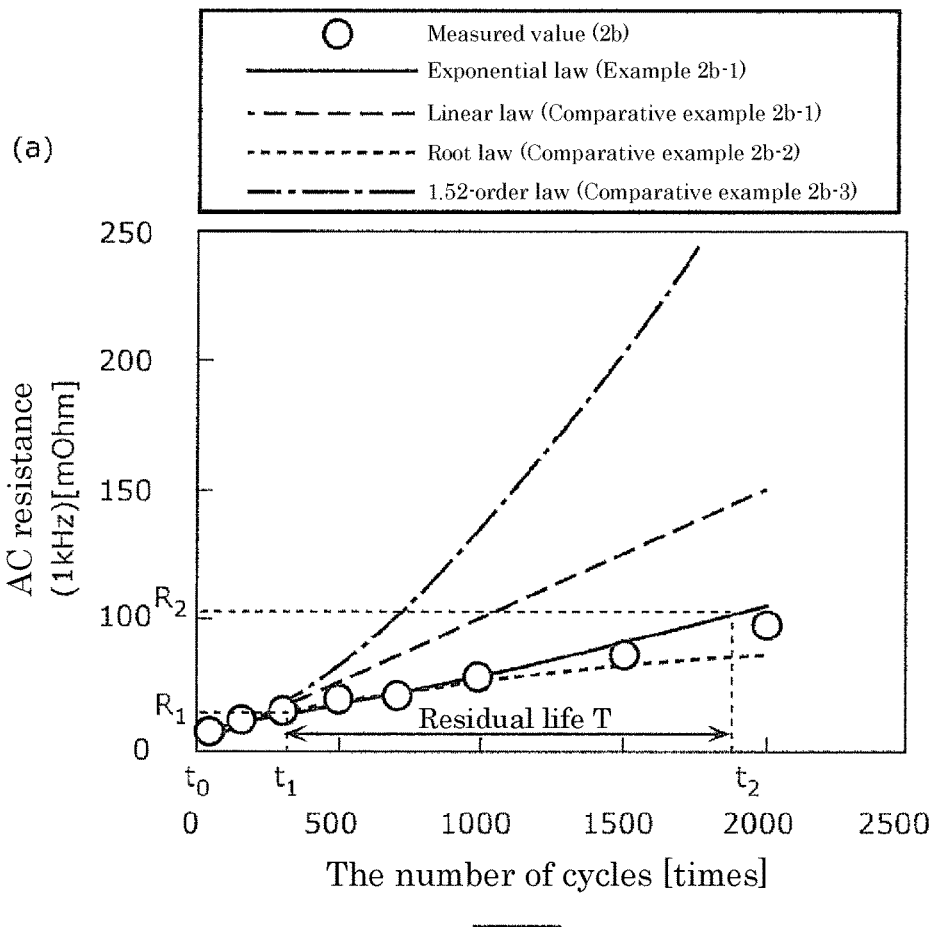
FIGS. 17A and 17B are views illustrating an effect obtained in a case where the life estimating apparatus according to the second modification of the embodiment of the present invention is the battery B and the AC resistance.
Figure 17:

FIGS. 14 to 17 are views illustrating the effect obtained by the life estimating apparatus 100 according to the second modification of the embodiment of the present invention. Specifically, FIG. 14 is a view illustrating an effect obtained by the life estimating apparatus 100 when the energy storage device 200 is the battery A while the resistance value R is the DC resistance, and FIG. 15 is a view illustrating an effect obtained by the life estimating apparatus 100 when the energy storage device 200 is the battery A while the resistance value R is the AC resistance. FIG. 16 is a view illustrating an effect obtained by the life estimating apparatus 100 when the energy storage device 200 is the battery B while the resistance value R is the DC resistance, and FIG. 17 is a view illustrating an effect obtained by the life estimating apparatus 100 when the energy storage device 200 is the battery B while the resistance value R is the AC resistance.

As illustrated in FIG. 14, the 45° C., 1C cycle test was performed on the battery A to calculate relational expression given by Equation 2. Specifically, the exponential-law relational expression $R=f(t)$ was calculated from the transition of the resistance value R of the DC resistance in the range of 0 cycle ($t_0$ in FIG. 14) to 300 cycles ($t_1$ in FIG. 14). As a result, relational expression $R=121.8 \times \exp(6.467 \times 10^{-4} \times t)$ is obtained.

Because $R_1=149.7$ mOhm was obtained for $t_1=300$ cycles, the first resistance value of the battery A at the first time point was set to $R_1=149.7$ mOhm, and the first accumulated use period was set to $t_1=300$ cycles. The second resistance value of the battery A at the second time point (life expiration time point) was set to $R_2=424.4$ mOhm, and the second accumulated use period $t_2$ is calculated from $t_2=f^{-1}(R_2)$. As a result, second accumulated use period $t_2=1930$ cycles is calculated.

Therefore, the residual life T was calculated as $T=t_2-t_1=1630$ cycles. At this point, because the measured value was 1700 cycles, the residual life T calculated using the exponential-law relational expression $R=f(t)$ agreed with the measured value.

The residual life was predicted as a comparative example by a conventional method. Specifically, based on the result of the resistance values R of 0 cycle to 300 cycles, a prediction formula was obtained assuming that the relationship between the resistance value R and the number of cycles was (1) linear law, (2) root law, and (3) 1.52-order law. Each prediction formula is as follows.

$$R=0.121 \times t+115.2 \quad \text{(1) Linear law}$$

$$R=2.19 \times t^{1/2}+110.3 \quad \text{(2) Root law}$$

$$R=5.77 \times 10^{-3} \times t^{1.52}+118.5 \quad \text{(3) 1.52-order law}$$

Similarly to the exponential law, defining $t_1=300$ cycles, $t_2$ was calculated as the life when the resistance value reached $R_2=424.4$ mOhm, thereby calculating the residual life $T=t_2-t_1$. The calculation results of the residual life T were (1) 2243 cycles, (2) 20160 cycles, and (3) 982 cycles for (1) linear law, (2) root law, and (3) 1.52-order law, respectively.

Therefore, as illustrated in FIG. 14B, differences between the residual lives T and 1700 cycles of the measured value became (1) +543 cycles, (2) +18460 cycles, and (3) −718 cycles for (1) linear law, (2) root law, and (3) 1.52-order law, respectively. As described above, the life estimating apparatus 100 of the second modification can estimate the residual life with extremely high accuracy compared with the conventional method.

Then, as illustrated in FIG. 15, the 45° C., 1C cycle test was performed on the battery A to calculate the exponential-law relational expression $R=f(t)$ from the transition of the resistance value R of the AC resistance in the range of 0 cycle ($t_0$ in FIG. 15) to 300 cycles ($t_1$ in FIG. 15). As a result, relational expression $R=83.9 \times \exp(6.410 \times 10^{-4} \times t)$ is obtained.

Because $R_1=104.9$ mOhm was obtained for $t_1=300$ cycles, the first resistance value of the battery A at the first time point was set to $R_1=104.9$ mOhm, and the first accumulated use period was set to $t_1=300$ cycles. The second resistance value of the battery A at the second time point (life expiration time point) was set to $R_2=291.2$ mOhm, and the second accumulated use period $t_2$ is calculated from $t_2=f^{-1}(R_2)$. As a result, second accumulated use period $t_2=1941$ cycles is calculated.

Therefore, the residual life T was calculated as $T=t_2-t_1=1641$ cycles. At this point, because the measured value was 1700 cycles, the residual life T calculated using the exponential-law relational expression $R=f(t)$ agreed with the measured value.

Then, the prediction formula was obtained as a comparative example with respect to each of the (1) linear law, (2) root law, and (3) 1.52-order law. Each prediction formula is as follows.

$$R=0.147 \times t+63.9 \quad \text{(1) Linear law}$$

$$R=2.77 \times t^{1/2}+56.9 \quad \text{(2) Root law}$$

$$R=6.87 \times 10^{-3} \times t^{1.52}+68.1 \quad \text{(3) 1.52-order law}$$

Similarly to the exponential law, defining $t_1=300$ cycles, $t_2$ was calculated as the life when the resistance value reached $R_2=291.2$ mOhm, thereby calculating the residual life $T=t_2-t_1$. The calculation result of the residual life T were (1) 1246 cycles, (2) 6834 cycles, and (3) 629 cycles for (1) linear law, (2) root law, and (3) 1.52-order law, respectively, the differences between the residual lives T and 1700 cycles of the measured value became (1) −454 cycles, (2) +5134 cycles, and (3) −1071 cycles, respectively. As described above, the life estimating apparatus 100 of the second modification can estimate the residual life with extremely high accuracy compared with the conventional method.

Then, as illustrated in FIG. 16, the 45° C., 1C cycle test was performed on the battery B to calculate the exponential-law relational expression $R=f(t)$ from the transition of the resistance value R of the DC resistance in the range of 0 cycle ($t_0$ in FIG. 16) to 300 cycles ($t_1$ in FIG. 16). As a result, relational expression $R=101.7 \times \exp(2.875 \times 10^{-4} \times t)$ is obtained.

Because $R_1=112.1$ mOhm was obtained for $t_1=300$ cycles, the first resistance value of the battery B at the first time point was set to $R_1=112.1$ mOhm, and the first accumulated use period was set to $t_1=300$ cycles. The second resistance value of the battery B at the second time point (life expiration time point) was set to $R_2=180$ mOhm, and the second accumulated use period $t_2$ is calculated from $t_2=f^{-1}(R_2)$. As a result, second accumulated use period $t_2=1985$ cycles is calculated.

Therefore, the residual life T was calculated as $T=t_2-t_1=1685$ cycles. At this point, because the measured value was 1700 cycles, the residual life T calculated using the exponential-law relational expression $R=f(t)$ agreed with the measured value.

Then, the prediction formula was obtained as a comparative example with respect to each of the (1) linear law, (2) root law, and (3) 1.52-order law. Each prediction formula is as follows.

$$R=0.047 \times t+100.0 \quad \text{(1) Linear law}$$

$$R=0.902 \times t^{1/2}+97.5 \quad \text{(2) Root law}$$

$$R=2.11 \times 10^{-3} \times t^{1.52}+101.4 \quad \text{(3) 1.52-order law}$$

Similarly to the exponential law, defining $t_1=300$ cycles, $t_2$ was calculated as the life when the resistance value reached $R_2=180$ mOhm, thereby calculating the residual life $T=t_2-t_1$. The calculation result of the residual life T were (1) 1402 cycles, (2) 8064 cycles, and (3) 717 cycles for (1) linear law, (2) root law, and (3) 1.52-order law, respectively, the differences between the residual lives T and 1700 cycles of the measured value became (1) −298 cycles, (2) +6364 cycles, and (3) −983 cycles, respectively. As described above, the life estimating apparatus 100 of the second modification can estimate the residual life with extremely high accuracy compared with the conventional method.

Then, as illustrated in FIG. 17, the 45° C., 1C cycle test was performed on the battery B to calculate the exponential-law relational expression $R=f(t)$ from the transition of the resistance value R of the AC resistance in the range of 0 cycle (to in FIG. 17) to 300 cycles ($t_1$ in FIG. 17). As a result, relational expression $R=59.0 \times \exp(2.811 \times 10^{-4} \times t)$ is obtained.

Because $R_1=65.5$ mOhm was obtained for $t_1=300$ cycles, the first resistance value of the battery B at the first time point was set to $R_1=65.5$ mOhm, and the first accumulated use period was set to $t_1=300$ cycles. The second resistance value of the battery B at the second time point (life expiration time point) was set to $R_2=100.4$ mOhm, and the second accumulated use period $t_2$ is calculated from $t_2=f^{-1}(R_2)$. As a result, second accumulated use period $t_2=1891$ cycles is calculated.

Therefore, the residual life T was calculated as $T=t_2-t_1=1591$ cycles. At this point, because the measured value was 1700 cycles, the residual life T calculated using the exponential-law relational expression $R=f(t)$ agreed with the measured value.

Then, the prediction formula was obtained as a comparative example with respect to each of the (1) linear law, (2) root law, and (3) 1.52-order law. Each prediction formula is as follows.

$$R=0.05 \times t+52.2 \quad \text{(1) Linear law}$$

$$R=0.811 \times t^{1/2}+52.2 \quad \text{(2) Root law}$$

$$R=2.27 \times 10^{-3} \times t^{1.52}+53.8 \quad \text{(3) 1.52-order law}$$

Similarly to the exponential law, defining $t_1=300$ cycles, $t_2$ was calculated as the life when the resistance value reached $R_2=100.4$ mOhm, thereby calculating the residual life $T=t_2-t_1$. The calculation result of the residual life T were (1) 664 cycles, (2) 3232 cycles, and (3) 387 cycles for (1) linear law, (2) root law, and (3) 1.52-order law, respectively, the differences between the residual lives T and 1700 cycles of the measured value became (1) −1036 cycles, (2) +1532 cycles, and (3) −1313 cycles, respectively. As described above, the life estimating apparatus 100 of the second modification can estimate the residual life with extremely high accuracy compared with the conventional method.

Thus, the life estimating apparatus 100 according to the second modification of the embodiment of the present invention acquires the relational expression, in which the resistance value is proportional to the exponential function having a variable in which the accumulated use period is multiplied by a predetermined constant. As a result of the study and experiment, the inventors found that the relational expression, in which the resistance value is proportional to the exponential function having a variable in which the accumulated use period is multiplied by a predetermined constant, accurately expresses the variation with time of the resistance value. In the life estimating apparatus 100, because the relationship between the resistance value and the accumulated use period can correctly be given by the relational expression, the residual life of the energy storage device 200 can correctly be estimated.

Alternatively, similarly to the embodiment, in the case that the value in which the resistance value is differentiated by the accumulated use period twice becomes a positive value, the relational expression acquisition unit 110 may set the accumulated use period to the relational expression acquisition period, and acquire the relational expression obtained from the relationship between the resistance value and the accumulated use period up to the relational expression acquisition period elapsed time point. Alternatively, similarly to the first modification, the relational expression acquisition unit 110 may acquire the relational expression by calculating the relational expression from the relationship between the resistance value and the accumulated use period up to the relational expression acquisition period elapsed time point.

Third Modification

A third modification of the embodiment of the present invention will be described below. In the embodiment, the residual life estimating unit 120 estimates the residual life of the energy storage device 200 using the relational expression acquired by the relational expression acquisition unit 110 with no change of the relational expression. Meanwhile, in the third modification, the residual life estimating unit corrects the relational expression to estimate the residual life.

Figure 18:
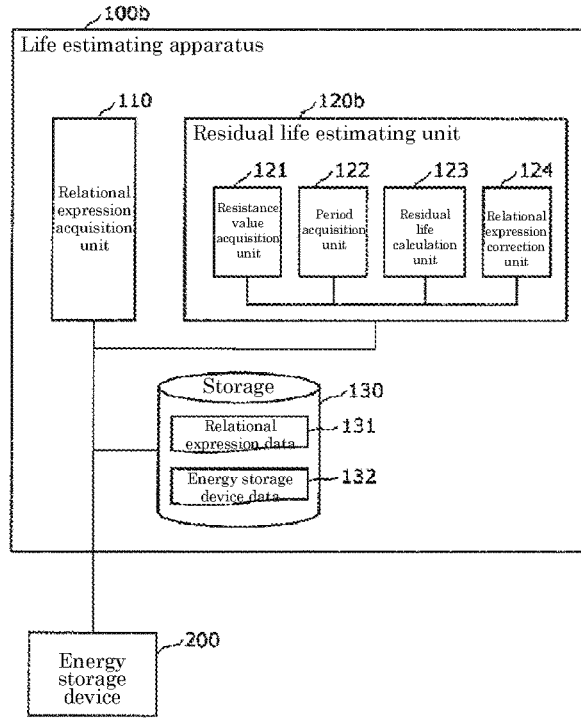
FIG. 18 is a block diagram illustrating a configuration of a life estimating apparatus according to a third modification of the embodiment of the present invention.

FIG. 18 is a block diagram illustrating a configuration of a life estimating apparatus 100b according to the third modification of the embodiment of the present invention.

As illustrated FIG. 18, a residual life estimating unit 120b of the life estimating apparatus 100b included in an energy storage system 10b includes a relational expression correction unit 124 that corrects the relational expression acquired by the relational expression acquisition unit 110. The residual life estimating unit 120b estimates the residual life using the relational expression corrected by the relational expression correction unit 124.

Specifically, the relational expression correction unit 124 calculates the relational expression again in the case that a difference between the resistance value of the energy storage device 200 in the accumulated use period, which is calculated using the relational expression acquired by the relational expression acquisition unit 110, and the resistance value acquired by the resistance value acquisition unit 121 exceeds a predetermined value.

For example, during the real use in the automobile, the relational expression correction unit 124 acquires the data pair corresponding to the accumulated use period and resistance value, and determines whether the difference exceeds the predetermined value. When determining that the difference exceeds the predetermined value, the relational expression correction unit 124 newly calculates the relational expression from the relationship between the resistance value and the accumulated use period up to the accumulated use period elapsed time point at which the difference exceeds the predetermined value.

Specifically, the relational expression correction unit 124 calculates the relational expression such that the resistance value is given by the Nth-degree function (N≥3) (specifically, the polynomial including the cubic function) of the accumulated use period. The relational expression correction unit 124 corrects the relational expression by writing the calculated relational expression in the relational expression data 131.

As described above, the life estimating apparatus 100b according to the third modification of the embodiment of the present invention corrects the relational expression to improve the accuracy of the relational expression, which allows the correct estimation of the residual life.

Fourth Modification

A fourth modification of the embodiment of the present invention will be described below. In the embodiment, the life estimating apparatus 100 includes the relational expression acquisition unit 110, the residual life estimating unit 120, and the storage 130, and the residual life estimating unit 120 includes the resistance value acquisition unit 121, the period acquisition unit 122, and the residual life calculation unit 123. Meanwhile, in the fourth modification, the life estimating apparatus only includes the relational expression acquisition unit and the residual life estimating unit.

Figure 19:
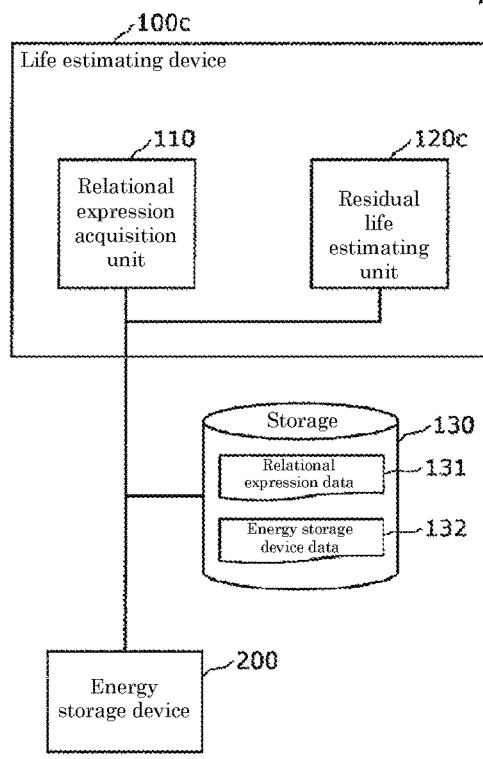
FIG. 19 is a block diagram illustrating a configuration of a life estimating apparatus according to a fourth modification of the embodiment of the present invention.

FIG. 19 is a block diagram illustrating a configuration of a life estimating apparatus 100c according to the fourth modification of the embodiment of the present invention. That is, FIG. 19 is the block diagram illustrating the minimum configuration of the life estimating apparatus.

As illustrated FIG. 19, the life estimating apparatus 100c included in an energy storage system 10c includes the relational expression acquisition unit 110 having the function similar to the embodiment and a residual life estimating unit 120c. The life estimating apparatus 100c estimates the residual life by exchanging information with the external storage 130.

It is only necessary for the residual life estimating unit 120c to be able to estimate the residual life using the relational expression acquired by the relational expression acquisition unit 110, and the residual life estimating unit 120c does not necessarily includes the resistance value acquisition unit 121, the period acquisition unit 122, and the residual life calculation unit 123 unlike the embodiment. That is, the life estimating apparatus may include at least the relational expression acquisition unit and the residual life estimating unit.

Thus, the effect similar to the embodiment can be obtained by the life estimating apparatus 100c according to the fourth modification of the embodiment of the present invention.

Although the life estimating apparatus and energy storage system according to the embodiment of the present invention and the modifications thereof are described above, the present invention is not limited to the embodiment and the modifications. It is noted that the disclosed embodiment and modifications are illustrated only by way of example, but not restrictive.

The scope of the present invention is indicated not by the above description but by the claims, and the meanings equivalent to the claim and all the changes within the claims are also included in the present invention.

In the embodiment and the first, third, and fourth modifications, the relational expression acquisition unit acquires the relational expression in which the resistance value of the energy storage device 200 is given by the polynomial including the cubic function of the accumulated use period. The relational expression acquisition unit may acquire the relational expression in which the resistance value is given by a polynomial, which is an Nth-degree function (N≥4) of the accumulated use period without including the cubic function. The relational expression acquisition unit may acquire a relational expression that is not the polynomial but only one term. That is, it is only necessary for the relational expression acquisition unit to acquire the relational expression in which the resistance value is given by the Nth-degree function (N≥3) of the accumulated use period. Therefore, the relational expression being able to express the state in which the resistance value increases exponentially with the passage of the accumulated use period can be set similarly to the embodiment and the modifications.

Figure 20:
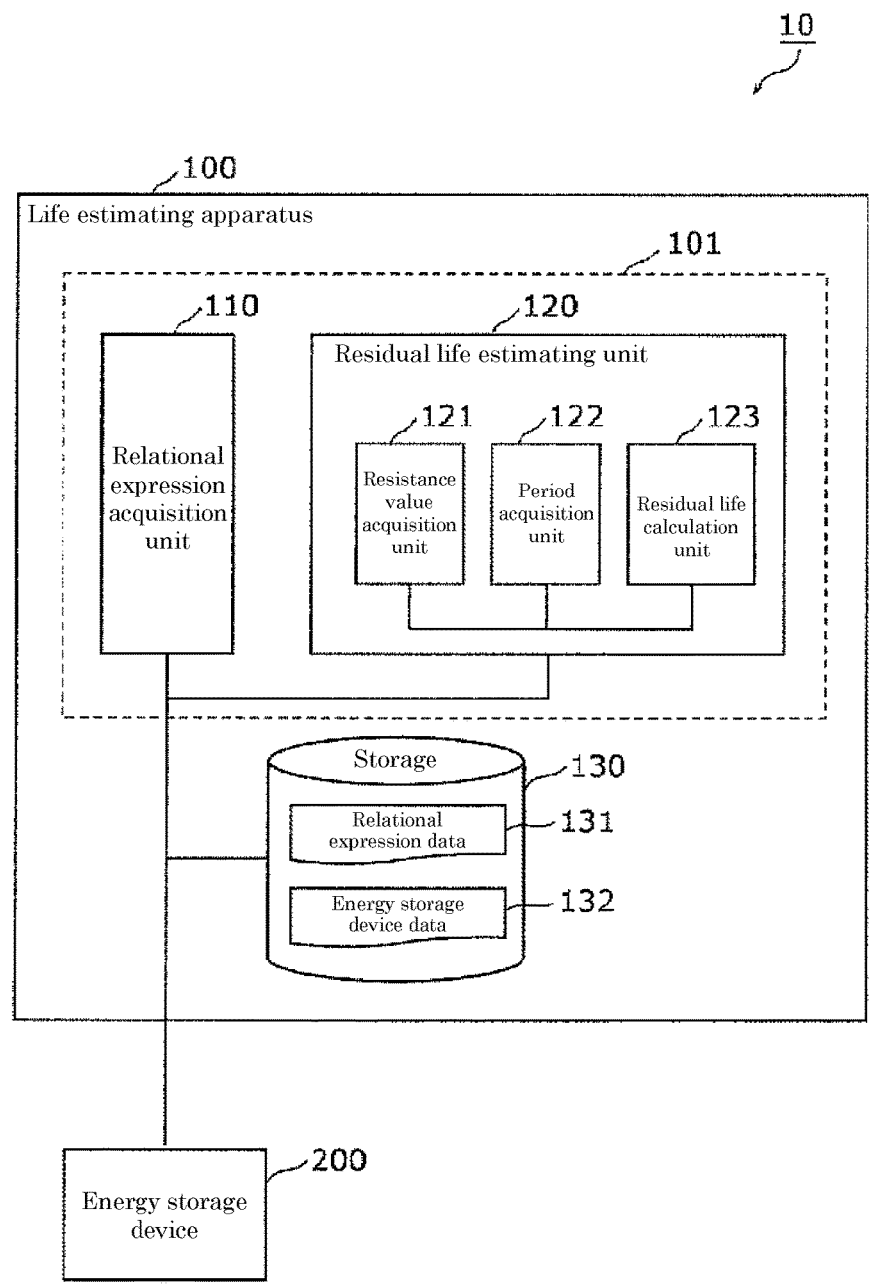
FIG. 20 is a block diagram illustrating a configuration in which the life estimating apparatus according to the embodiment of the present invention is constructed with an integrated circuit.

Typically, the processor included in the life estimating apparatus of the present invention is fabricated as an LSI (Large Scale Integration) of an integrated circuit. That is, for example, the present invention is implemented as an integrated circuit 101 including the relational expression acquisition unit 110 and the residual life estimating unit 120 as illustrated in FIG. 20. FIG. 20 is a block diagram illustrating a configuration in which the life estimating apparatus according to the embodiment of the present invention is constructed with the integrated circuit.

The processors included in the integrated circuit 101 may separately be formed into one chip, or some or all the processors may be formed into one chip.

Although the integrated circuit of FIG. 20 is constructed with the LSI, sometimes the integrated circuit is called an IC, a system LSI, a super LSI, and an ultra LSI according to a degree of integration.

The integrated circuit forming technique is not limited to the LSI, and the integrated circuit may be fabricated by a dedicated circuit or a general-purpose processor. An FPGA (Field Programmable Gate Array) that is programmable after the production of the LSI or a reconfigurable processor in which connection or setting of a circuit cell in the LSI can be re-configured may be used as the integrated circuit.

When the LSI is replaced with a new or derivative technology with the progress of the semiconductor technology, the functional block may be integrated using the technology.

Biotechnology may be applied to the integrated circuit.

Not only the present invention can be implemented as the life estimating apparatus, but also the present invention can be implemented as s life estimating method including characteristic processing performed by the life estimating apparatus.

The present invention can also be implemented as a program causing a computer to execute the characteristic processing included in the life estimating method, or as a non-transient recording medium, such as a CD-ROM, in which the program is recorded. The program can be distributed through the recording medium such as the CD-ROM and a transmission medium such as the Internet.

It is noted that the mode constructed with any combination of the embodiment and the modifications is included in the scope of the present invention. For example, the third modification may be made in the first modification, or the third and fourth modifications may be made in the second modification.

INDUSTRIAL APPLICABILITY

The present invention can be used in the life estimating apparatus that can correctly estimate the residual life of the energy storage device.

DESCRIPTION OF REFERENCE SIGNS 10,10a,10b,10c energy storage system
100,100a,100b,100c life estimating apparatus
101 integrated circuit
110,110a relational expression acquisition unit
111 relational expression calculation unit
120,120b,120c residual life estimating unit
121 resistance value acquisition unit
122 period acquisition unit
123 residual life calculation unit
124 relational expression correction unit
130 storage
131 relational expression data
132 energy storage device data
200 energy storage device
300 housing case

The invention claimed is:

1. A life estimating apparatus estimating a residual life that is of a usable accumulated residual period of an energy storage device, the life estimating apparatus comprising:
a relational expression acquisition unit that acquires a relational expression, in which a resistance value of a DC resistance or an AC resistance of the energy storage device at an accumulated use period elapsed time point that is of an accumulated value of a use period of the energy storage device is given by an expression including a term of a function of the accumulated use period; and
a residual life estimating unit that estimates the residual life using the acquired relational expression, wherein, when a value in which the resistance value in the relational expression is differentiated by the accumulated use period twice becomes a positive value, the relational expression acquisition unit sets the accumulated use period to a relational expression acquisition period, and acquires the relational expression obtained from a relationship between the resistance value and the accumulated use period up to the relational expression acquisition period elapsed time point.

2. The life estimating apparatus according to claim 1, wherein the relational expression acquisition unit acquires the relational expression in which the resistance value is given by a polynomial including the cubic function of the accumulated use period.

3. The life estimating apparatus according to claim 1, wherein the relational expression acquisition unit acquires the relational expression by calculating the relational expression from the relationship between the resistance value and the accumulated use period up to the relational expression acquisition period elapsed time point.

4. The life estimating apparatus according to claim 1, wherein the relational expression acquisition unit acquires the relational expression, in which the resistance value is proportional to the exponential function having a variable in which the accumulated use period is multiplied by a predetermined constant.

5. The life estimating apparatus according to claim 1, wherein the residual life estimating unit includes:
a resistance value acquisition unit that acquires a first resistance value and a second resistance value, the first resistance value being the resistance value at a predetermined time point, the second resistance value being the resistance value at a life expiration time point of the energy storage device;
a period acquisition unit that acquires a first accumulated use period and a second accumulated use period, the first accumulated use period being the accumulated use period in the first resistance value and obtained from the relational expression, the second accumulated use period being the accumulated use period in the second resistance value and obtained from the relational expression; and
a residual life calculation unit that calculates the residual life of the energy storage device from the predetermined time point by subtracting the first accumulated use period from the second accumulated use period.

6. The life estimating apparatus according to claim 1, wherein the residual life estimating unit further includes a relational expression correction unit that corrects the relational expression acquired by the relational expression acquisition unit,
wherein the residual life is estimated using the corrected relational expression.

7. The life estimating apparatus according to claim 1, wherein the energy storage device is a lithium-ion secondary battery containing a layered-structure lithium transition metal oxide as a positive active material,
the relational expression acquisition unit acquires the relational expression for the lithium-ion secondary battery, and
the residual life estimating unit estimates the residual life of the lithium ion secondary battery.

8. An energy storage system comprising:
an energy storage device; and
the life estimating apparatus according to claim 1 configured to estimate the residual life that is of the usable accumulated residual period of the energy storage device.

9. A life estimating method in which a computer estimates a residual life that is of a usable accumulated residual period of an energy storage device, the life estimating method comprising:
acquiring a relational expression, in which a resistance value of a DC resistance or an AC resistance of the energy storage device at an accumulated use period elapsed time point that is of an accumulated value of a use period of the energy storage device is given by an expression including a term of a function of the accumulated use period; and
estimating the residual life using the acquired relational expression,
wherein, when a value in which the resistance value in the relational expression is differentiated by the accumulated use period twice becomes a positive value, the accumulated use period is set to a relational expression acquisition period, and the relational expression is obtained from a relationship between the resistance value and the accumulated use period up to the relational expression acquisition period elapsed time point.

10. An integrated circuit estimating a residual life that is of a usable accumulated residual period of an energy storage device, the integrated circuit comprising:
a relational expression acquisition unit that acquires a relational expression, in which a resistance value of a DC resistance or an AC resistance of the energy storage device at an accumulated use period elapsed time point that is of an accumulated value of a use period of the energy storage device is given by an expression including a term of a function of the accumulated use period; and
a residual life estimating unit that estimates the residual life using the acquired relational expression,
wherein, when a value in which the resistance value in the relational expression is differentiated by the accumulated use period twice becomes a positive value, the relational expression acquisition unit sets the accumulated use period to a relational expression acquisition period, and acquires the relational expression obtained from a relationship between the resistance value and the accumulated use period up to the relational expression acquisition period elapsed time point.

11. The life estimating apparatus according to claim 1, wherein the relational expression acquisition unit acquires the relational expression in which the resistance value is given by an expression including a term of an Nth-degree function ($N \geq 3$) or an exponential function of the accumulated use period.

* * * * *